(12) United States Patent
Hwu et al.

(10) Patent No.: US 11,502,189 B2
(45) Date of Patent: *Nov. 15, 2022

(54) CHARGE STORAGE AND SENSING DEVICES AND METHODS

(71) Applicants: Taiwan Semiconductor Manufacturing Co., Ltd., Hsinchu (TW); National Taiwan University, Taipei (TW)

(72) Inventors: Jenn-Gwo Hwu, Taipei (TW); Chien-Shun Liao, Hsinchu (TW); Wei-Chih Kao, Taipei (TW)

(73) Assignees: Taiwan Semiconductor Manufacturing Co., Ltd., Hsinchu (TW); National Taiwan University, Taipei (TW)

(*) Notice: Subject to any disclaimer, the term of this patent is extended or adjusted under 35 U.S.C. 154(b) by 0 days.

This patent is subject to a terminal disclaimer.

(21) Appl. No.: 17/111,428

(22) Filed: Dec. 3, 2020

(65) Prior Publication Data
US 2021/0119026 A1 Apr. 22, 2021

Related U.S. Application Data

(63) Continuation of application No. 16/844,663, filed on Apr. 9, 2020, now Pat. No. 10,868,158, which is a (Continued)

(51) Int. Cl.
*H01L 29/739* (2006.01)
*H01L 29/51* (2006.01)
(Continued)

(52) U.S. Cl.
CPC ...... *H01L 29/7391* (2013.01); *G11C 16/0466* (2013.01); *G11C 16/10* (2013.01);
(Continued)

(58) Field of Classification Search
CPC ............. H01L 29/7391; H01L 29/0649; H01L 29/0684; H01L 29/40117; H01L 29/4234;
(Continued)

(56) References Cited

U.S. PATENT DOCUMENTS 4,885,623 A 12/1989 Holm-Kennedy et al.
5,021,841 A 6/1991 Leburton et al.
(Continued)

FOREIGN PATENT DOCUMENTS

CN 1787224 A * 6/2006 ......... H01L 27/2418
DE 602005002539 T2 * 6/2008 ....... H01L 29/76816

OTHER PUBLICATIONS

Liao et al., "Energy-Saving Write/Read Operation of Memory Cell by Using Separated Storage Device and Remote Reading With an MIS Tunnel Diode Sensor," *IEEE Journal of the Electron Devices Society* 4(6):424-429, 2016.
(Continued)

*Primary Examiner* — Fernando Hidalgo
(74) *Attorney, Agent, or Firm* — Seed IP Law Group LLP

(57) ABSTRACT

Charge storage and sensing devices having a tunnel diode operable to sense charges stored in a charge storage structure are provided. In some embodiments, a device includes a substrate, a charge storage device on the substrate, and tunnel diode on the substrate adjacent to the charge storage device. The tunnel diode includes a tunnel diode dielectric layer on the substrate, and a tunnel diode electrode on the tunnel diode dielectric layer. A substrate electrode is disposed on the doped region of the substrate, and the tunnel diode electrode is positioned between the charge storage device and the substrate electrode.

20 Claims, 16 Drawing Sheets

Related U.S. Application Data continuation of application No. 16/142,898, filed on Sep. 26, 2018, now Pat. No. 10,651,300.

(51) Int. Cl.
| | |
|---|---|
| H01L 29/49 | (2006.01) |
| H01L 29/45 | (2006.01) |
| H01L 29/06 | (2006.01) |
| G11C 16/10 | (2006.01) |
| H01L 29/66 | (2006.01) |
| G11C 16/04 | (2006.01) |
| H01L 29/423 | (2006.01) |
| G11C 16/26 | (2006.01) |
| H01L 21/28 | (2006.01) |

(52) U.S. Cl.
CPC .......... *G11C 16/26* (2013.01); *H01L 29/0649* (2013.01); *H01L 29/0684* (2013.01); *H01L 29/40117* (2019.08); *H01L 29/4234* (2013.01); *H01L 29/45* (2013.01); *H01L 29/4966* (2013.01); *H01L 29/513* (2013.01); *H01L 29/518* (2013.01); *H01L 29/66356* (2013.01)

(58) Field of Classification Search
CPC ... H01L 29/45; H01L 29/4966; H01L 29/513; H01L 29/518; H01L 29/66356; H01L 27/11568; H01L 27/1026; H01L 29/792; H01L 29/88; H01L 27/10805; G11C 16/0466; G11C 16/10; G11C 16/26
USPC ........................................ 365/125.28, 185.28
See application file for complete search history.

(56) References Cited

U.S. PATENT DOCUMENTS

| | | | |
|---|---|---|---|
| 5,093,699 | A | 3/1992 | Weichold et al. |
| 6,208,559 | B1 | 3/2001 | Tu et al. |
| 6,310,798 | B1 * | 10/2001 | Morimoto ............... G11C 11/38 365/159 |
| 7,030,434 | B1 | 4/2006 | Krautschneider et al. |
| 2001/0054727 | A1 | 12/2001 | Hofmann et al. |
| 2005/0067612 | A1 | 3/2005 | Busta et al. |
| 2015/0005610 | A1 | 1/2015 | Zhang |
| 2018/0090626 | A1 | 3/2018 | Yamashita |
| 2018/0358079 | A1 | 12/2018 | Jeon et al. |
| 2019/0019802 | A1 * | 1/2019 | Yoo ................... H01L 29/78391 |
| 2020/0105782 | A1 * | 4/2020 | Guo .................. H01L 27/11582 |

OTHER PUBLICATIONS

Liao et al., "Subthreshold Swing Reduction by Double Exponential Control Mechanism in an MOS Gated-MIS Tunnel Transistor," *IEEE Transactions on Electron Devices* 62(6):2061-2065, 2015.

Baek et al., "Mechanism of Negative Transconductance in Heterostructure Field-Effect Transistors," *IEEE Trans. Electron Devices* 37(8):1917-1921, 1990.

Chen et al., "A Novel Ultrafast Functional Device: Resonant Tunneling High Electron Mobility Transistor," in *Proc. IEEE Hong Kong Electron Devices Meet.*, Jun. 29, 1996, pp. 60-63.

Chen et al., "InGaAs/AlAs/InGaAsP Resonant Tunneling Bipolar Transistors Grown by Chemical Beam Epitaxy," in *Proc. IEEE/ Cornell Conference on Advanced Concepts in High Speed Semiconductor Devices and Circuits*, Ithaca, NY, Aug. 2-4, 1993, pp. 290-298.

Cheng et al., "A Comprehensive Study of Bistable Gated Bipolar Device," *IEEE Trans. Electron Devices* 53(10):2589-2597, 2006.

Dağtekin et al., "Investigation of Partially Gated Si Tunnel FETs for Low Power Integrated Optical Sensing," in *44th European Solid State Device Research Conf.*, Venice, Italy, Sep. 22-26, 2014, pp. 190-193.

Esaki et al., "Superlattice and Negative Differential Conductivity in Semiconductors," *IBM J. Res. Develop.* 14(1):61-65, 1970.

Favaro et al., "Strained Layer AlGaAs—GaAs—InGaAs Real-Space Transferred Electron Devices," *Electronics Lett.* 26(16):1264-1265, 1990.

Gružinskis et al., "Gunn Effect and THz Frequency Power Generation In $n^+$-n-$n^+$GaN Structures", *Materials Science Forum* 297-298:341-344, 1999, (5 Pages).

Kim et al., "Field-Induced Interband Tunneling Effect Transistor (FITET) With Negative-Differential Transconductance and Negative-Differential Conductance," *IEEE Trans. Nanotech.* 4(3):317-321, 2005.

Lai et al., "The Observation of Negative Transconductance Effect Caused by Real-Space-Transfer of Electrons in Metal Oxide Semiconductor Field Effect Transistors Fabricated with $Ta_2O_5$ Gate Dielectric," *IEEE Electron Device Lett.* 22(3):142-144, 2001.

Lai et al., "Ultrahigh and Controllable Drain Current Peak-to-Valley Ratio in Negative Resistance Field-Effect Transistors with a Strained InGaAs Channel," *IEEE Electron Device Lett.* 15(9):333-335, 1994.

Lee et al., "Monolithic AlAs—InGaAs—InGaP—GaAs HRT-FETS With PVCR of 960 at 300 K," *IEEE Electron Device Lett.* 26(2):50-52, 2005.

Liao et al., "Remote Gate-Controlled Negative Transconductance in Gated MIS Tunnel Diode," *IEEE Transactions on Electron Devices* 63(7):2864-2870, 2016.

Mensz et al., "High transconductance and large peak-to-valley ratio of negative differential conductance in three-terminal InGaAs/InAlAs real-space transfer devices," *Appl. Phys. Lett.* 57(24):2558-2560, 1990.

Neamen, *Semiconductor Physics and Devices: Basic Principles*, 3rd ed., McGraw-Hill, New York, N.Y., 2003, Chap. 8.6., "The Tunnel Diode," pp. 313-316.

Nguyen et al., "Gate-controllable negative differential conductance in graphene tunneling transistors," *Semicond. Sci. Technol.* 27(10):105018, 2012. (8 Pages).

Ruden et al., "Distributive Nature of Gate Current and Negative Transconductance in Heterostructure Field-Effect Transistors," *IEEE Trans. Electron Devices* 36(2):453-456, 1989.

Tsai et al., "P—N Double Quantum Well Resonant Interband Tunneling Diode with Peak-To-Valley Current Ratio of 144 at Room Temperature," *IEEE Electron Device Lett.* 15(9):357-359, 1994.

Versari et al., "MOSFET's Negative Transconductance at Room Temperature," *IEEE Trans. Electron Devices* 46(6):1189-1195, 1999.

Wu et al., "A Novel δ-Doped GaAs/InGaAs Real-Space Transfer Transistor with High Peak-to-Valley Ratio and High Current Driving Capability," *IEEE Electron Device Lett.* 16(3):112-114, 1995.

Wu et al., "Novel SiC/Si Heterostructure Negative-Differential-Resistance Diode for Use as Switch with High On/Off Current Ratio and Low Power Dissipation," *IEEE Electron Device Lett.* 19(8):294-296, 1998.

* cited by examiner

CHARGE STORAGE AND SENSING DEVICES AND METHODS

BACKGROUND

Memory cells are electronic circuits that are capable of storing information for some period of time. A memory cell is capable of storing a bit of binary information, e.g., a logical "1" or "0". Typically, the memory cell is set to store a logical 1 and reset to store a logical 0. The memory cell can be accessed to read the stored information (e.g., the voltage level, or the logical value). A conventional memory cell includes a storage device, such as a capacitor. The capacitor is charged by a voltage applied from a bit line to the capacitor, for example, through a transistor which is controlled by a voltage on a word line.

The capacitor is read by directly accessing the capacitor. That is, the charges are read directly from the capacitor, for example, by applying a gate voltage to the transistor and reading the charges transferred from the capacitor to the bit line.

BRIEF DESCRIPTION OF THE SEVERAL VIEWS OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
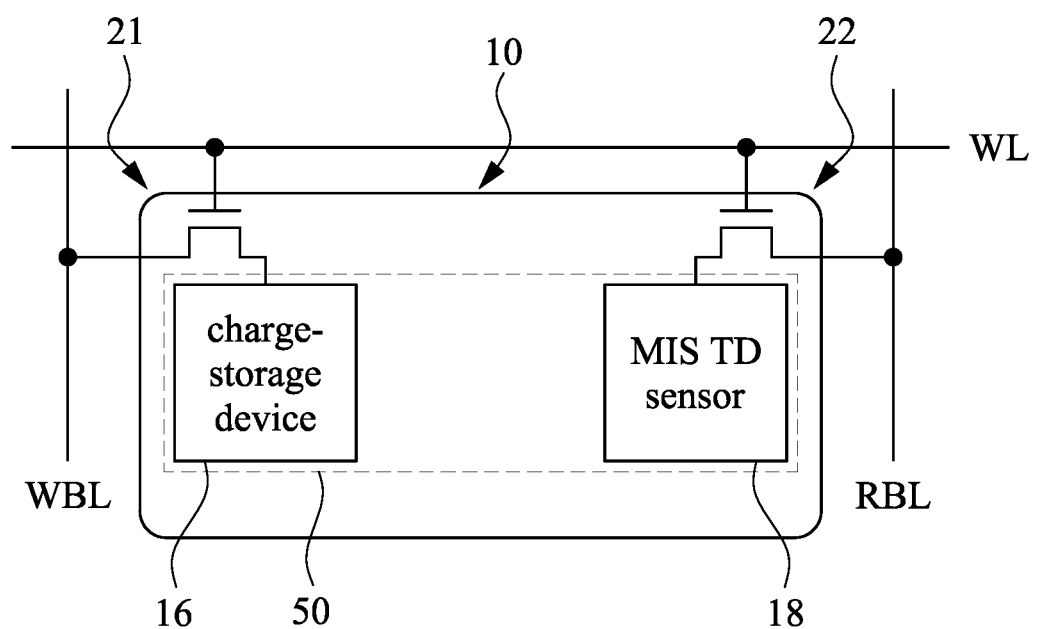
FIG. 1 is a schematic circuit diagram illustrating a memory cell, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Reference throughout the specification to deposition techniques for depositing dielectric layers, metals, or any other materials includes such processes as chemical vapor deposition (CVD), low-pressure chemical vapor deposition (LPCVD), metal organic chemical vapor deposition (MOCVD), plasma-enhanced chemical vapor deposition (PECVD), plasma vapor deposition (PVD), atomic layer deposition (ALD), molecular beam epitaxy (MBE), electroplating, electro-less plating, and the like. Specific embodiments are described herein with reference to examples of such processes. However, the present disclosure and the reference to certain deposition techniques should not be limited to those described.

Reference throughout the specification to etching techniques for selective removal of dielectric materials, metals, or any other materials includes such processes as wet chemical etching, reactive ion (plasma) etching (RIE), washing, wet cleaning, pre-cleaning, spray cleaning, chemical-mechanical planarization (CMP) and the like. Specific embodiments are described herein with reference to examples of such processes. However, the present disclosure and the reference to certain etching techniques should not be limited to those described.

The fin structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structure.

FIG. 1 is a schematic circuit diagram illustrating a memory cell 10 in accordance with some embodiments of the present disclosure.

The memory cell 10 includes a charge storage device 16 and a sensing device 18, which are electrically coupled to one another, for example, through a substrate 102 (see FIGS. 2 and 3A-3C). A first access transistor 21 is electrically coupled between the charge storage device 16 and a write bit line WBL. A second access transistor 22 is electrically coupled between the sensing device 18 and a read bit line RBL. Gate terminals of the first and second access transistors 21, 22 are electrically coupled to a word line WL.

The charge storage device 16 and the sensing device 18 may be referred to collectively as charge storage and sensing device 50. As will be described in further detail herein, during a read operation, information stored in the charge storage device 16 is sensed by the sensing device 18 without disturbing the charge stored in charge storage device 16.

Figure 2:
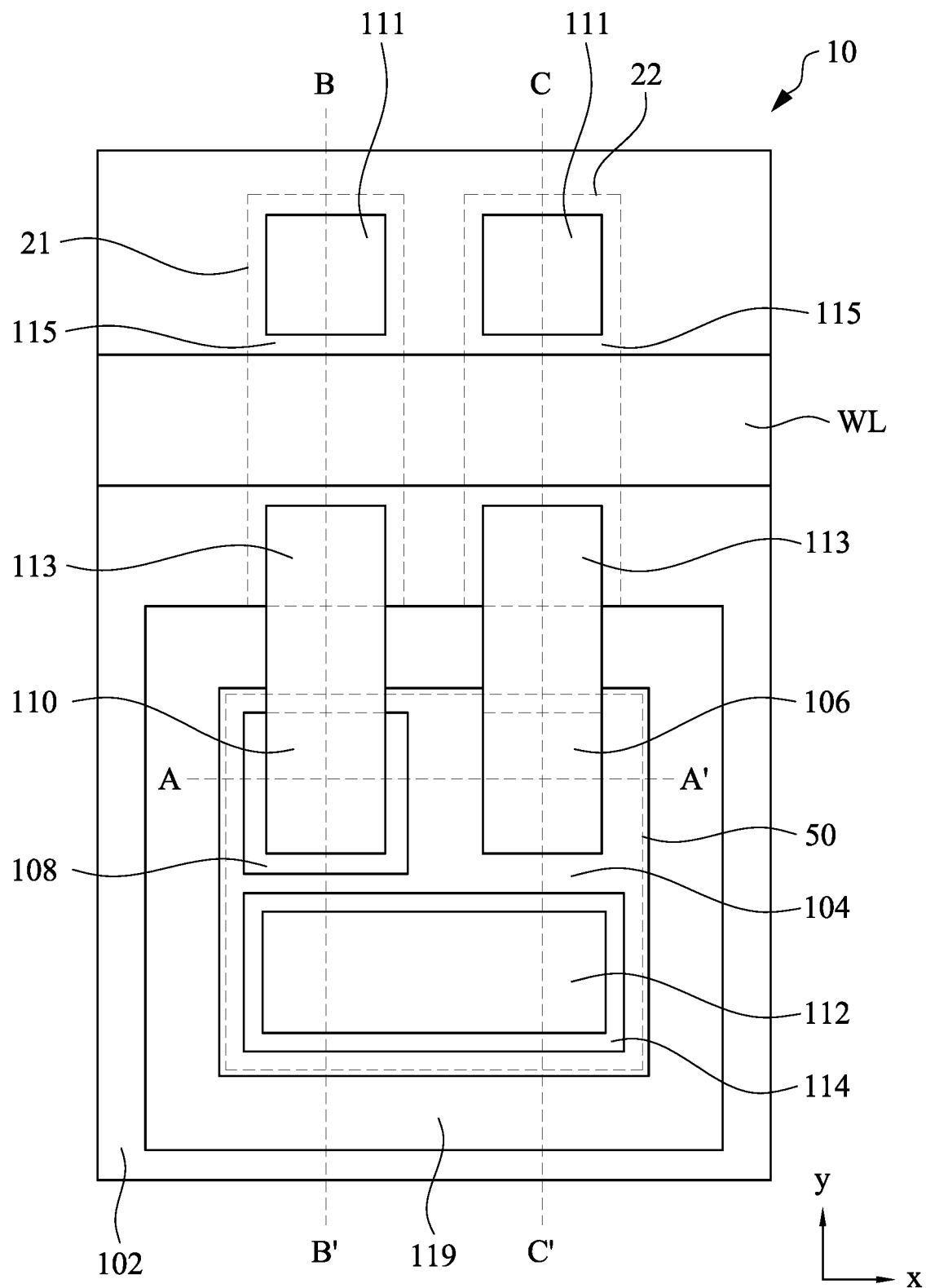
FIG. 2 is a top plan view illustrating the memory cell shown in FIG. 1, in accordance with some embodiments.
Figure 3A:
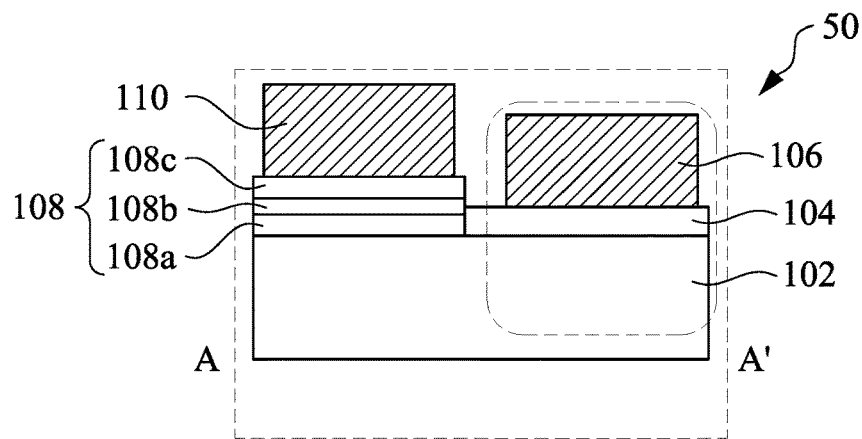
FIG. 3A is a cross-sectional view taken along the line A-A' of FIG. 2.
Figure 3B:
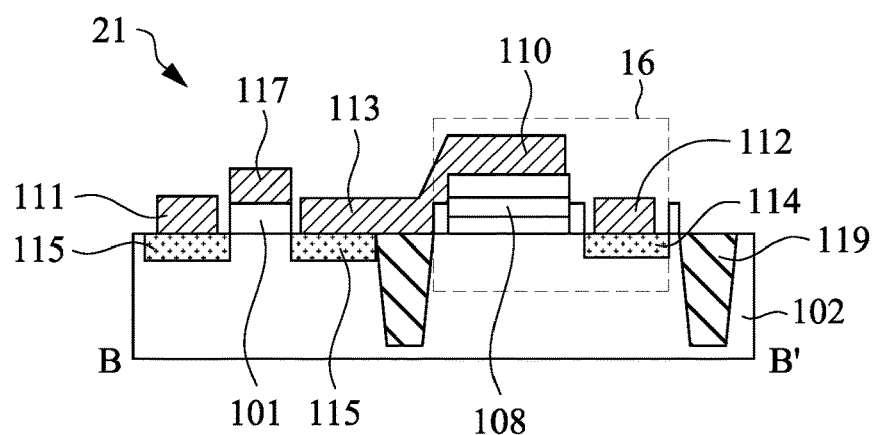
FIG. 3B is a cross-sectional view taken along the line B-B' of FIG. 2.
Figure 3C:
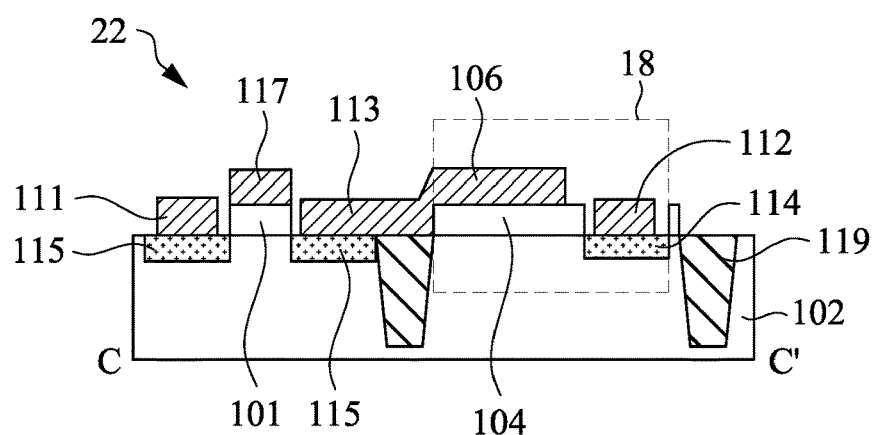
FIG. 3C is a cross-sectional view taken along the line C-C' of FIG. 2.

FIG. 2 is a top plan view illustrating the memory cell 10 shown in FIG. 1, in accordance with some embodiments. FIG. 3A is a cross-sectional view taken along the line A-A' of FIG. 2, FIG. 3B is a cross-sectional view taken along the line B-B' of FIG. 2, and FIG. 3C is a cross-sectional view taken along the line C-C' of FIG. 2.

The memory cell 10 includes the charge storage and sensing device 50, and the first and second access transistors 21, 22, which are coupled to the word line WL. The charge storage and sensing device 50 includes the charge storage device 16 and the sensing device 18, which are spaced apart from one another in a first direction (e.g., the x-direction). The first and second access transistors 21, 22 are generally disposed along a second direction (e.g., the y-direction) that is transverse to the first direction.

The charge storage device 16 and the sensing device 18 are disposed adjacent to one another on a substrate 102. The substrate 102 may be a substrate of any semiconductor material. In some embodiments, the substrate 102 is a silicon substrate; however, embodiments provided herein are not limited thereto. For example, in various embodiments, the substrate 102 may include gallium arsenide (GaAs), gallium nitride (GaN), silicon carbide (SiC), or any other semiconductor material. The substrate 102 may include various doping configurations depending on design specifications. In some embodiments, the substrate 102 is a p-type substrate having a concentration of p-type dopants, such as beryllium (Be), zinc (Zn), carbon (C), or the like. In other embodiments, the substrate 102 is a n-type substrate having a concentration of n-type dopants, such as silicon (Si), germanium (Ge), tin (Sn), or the like. The substrate 102 includes a doped region 114 that is doped with dopants of the same conductivity type as the substrate 102. For example, in embodiments where the substrate 102 is a p-type substrate, the doped region 114 includes p-type dopants, and in embodiments where the substrate 102 is a n-type substrate, the doped region 114 includes n-type dopants. The doped region 114 has a higher concentration of the dopants (whether p-type or n-type) than the surrounding portions (e.g., a bulk region) of the substrate 102. In some embodiments where the substrate 102 is an n-type substrate, the dopant concentration of the substrate 102 may be within a range from $n_i$ to $0.01*N_c$, inclusive, where n is the intrinsic carrier concentration of the substrate 102 and A/c is the effective density of states in the conduction band. In some embodiments where the substrate 102 is a p-type substrate, the dopant concentration of the substrate 102 may be within a range from n to $0.01*N_v$, inclusive, where $N_v$ is the effective density of states in the valence band. In some embodiments where the substrate 102 is an n-type substrate, the dopant concentration of the doped region 114 may be within a range from $0.01*N_c$ to $1*N_c$, inclusive, and in some embodiments where the substrate 102 is a p-type substrate, the dopant concentration of the doped region 114 may be within a range from $0.01*N_v$ to $1*N_v$, inclusive.

The substrate 102 may further include source/drain doped regions 115, which may form source and drain regions of the first and second access transistors 21, 22. Portions of the substrate 102 located between the source and drain regions of each of the first and second access transistors 21, 22 may form channel regions of the first and second access transistors 21, 22. In some embodiments, the source/drain doped regions 115 may be doped with dopants of the opposite conductivity type as the substrate 102.

The sensing device 18 may be a metal-insulator-semiconductor (MIS) tunnel diode sensing device (or MIS TD sensor), which includes a tunnel diode dielectric layer 104, a tunnel diode electrode 106, and underlying portions of the substrate 102.

The tunnel diode dielectric layer 104 is disposed on a surface (e.g., upper surface as shown in FIG. 3A) of the substrate 102, and the tunnel diode electrode 106 is disposed on the tunnel diode dielectric layer 104. In some embodiments, the tunnel diode dielectric layer 104 is an oxide layer, such as silicon dioxide ($SiO_2$) or hafnium dioxide ($HfO_2$). In some embodiments, the tunnel diode dielectric layer 104 may be a multi-layer structure such as a layered stack of $SiO_2$ and $HfO_2$. The tunnel diode electrode 106 may be formed of any material suitable for use as an electrode, and may be, for example, a metal electrode. The material used for the tunnel diode electrode 106 may be selected so that the majority carriers (e.g., holes) will encounter a Schottky barrier while tunneling through the tunnel diode dielectric layer 104 from the tunnel diode electrode 106 to the substrate 102. In some embodiments, the tunnel diode electrode 106 is formed of a material having a Schottky barrier height that is large enough that it can be significantly modulated by the tunnel diode dielectric layer 104 voltage (e.g., the voltage across the tunnel diode dielectric layer 104), as will be discussed in further detail later herein. In various embodiments, the tunnel diode electrode 106 may include one or more of aluminum (Al), tantalum nitride (TaN), and titanium aluminide (TiAl). In some embodiments, the tunnel diode electrode 106 may be a multi-layer structure such as a layered stack of TaN, TiAl, and Al.

The tunnel diode dielectric layer has a thickness (e.g., between the substrate 102 and the tunnel diode electrode 106) that is suitable for quantum tunneling through the tunnel diode dielectric layer 104. In some embodiments, the thickness of the tunnel diode dielectric layer 104 may be less than 10 nm. In some embodiments, the thickness of the tunnel diode dielectric layer 104 is less than 4 nm.

A charge storage structure 108 is disposed on the surface of the substrate 102 adjacent to the tunnel diode dielectric layer 104. In some embodiments, the charge storage structure 108 contacts the tunnel diode dielectric layer 104, for example, with side surfaces of the charge storage structure 108 and the tunnel diode dielectric layer 104 being in contact with one another.

The charge storage structure 108 may be any structure capable of storing electrical charges, for example, in response to an applied voltage, and may be a capacitive structure having one or more dielectric layers and conductive electrodes or plates, a floating gate structure, or any other structure capable of storing charges. In some embodiments, the charge storage structure 108 includes an oxide-nitride-oxide (ONO) stack. In some embodiments, the charge storage structure 108 includes a first layer 108a, a second layer 108b on the first layer, and a third layer 108c on the second layer. In some embodiments the first layer 108a is a first silicon oxide layer 108a (e.g., $SiO_2$), the second layer 108b is a silicon nitride layer 108b (e.g., $Si_3N_4$), and the third layer 108c is a second silicon oxide layer 108c (e.g., $SiO_2$). In some embodiments, the charge storage structure 108 may have a stacked structure including one or more layers of aluminum oxide (e.g., $Al_2O_3$), silicon dioxide ($SiO_2$), and hafnium dioxide ($HfO_2$).

The charge storage structure 108 may have a thickness (e.g., between the substrate 102 and the storage device electrode 110) that is greater than the thickness of the tunnel diode dielectric layer 104. In some embodiments, the charge storage structure 108 has a thickness that is greater than the thickness of the tunnel diode dielectric layer 104 and less than 1 μm.

The charge storage device 16 further includes a charge storage electrode 110, which is disposed on the charge storage structure 108. The charge storage electrode 110 is spaced apart from the tunnel diode electrode 106 by a distance that is small enough that the voltage drop across the tunnel diode dielectric layer 104 can be modulated by the electric field generated by charges stored in the charge storage structure 108. In some embodiments, the charge storage electrode 110 is spaced apart from the tunnel diode electrode 106 by a distance that is less than 10 μm. In some embodiments, the charge storage electrode 110 is spaced apart from the tunnel diode electrode 106 by a distance that is less than 100 nm.

The charge storage electrode 110 may be formed of any material suitable for use as an electrode, and may be, for example, a polycrystalline silicon (poly-SI) electrode or a metal electrode. In various embodiments, the charge storage electrode 110 may include one or more of aluminum (Al), tantalum nitride (TaN), and titanium aluminide (TiAl). In some embodiments, the charge storage electrode 110 may be a multi-layer structure such as a layered stack of TaN, TiAl, and Al. In some embodiments, the charge storage electrode 110 and the tunnel diode electrode 106 may be formed of the same material or materials.

The charge storage and sensing device 50 further includes a substrate electrode 112, which is provided on the doped region 114 of the substrate 102. In some embodiments, the substrate electrode 112 generally extends along the first direction (e.g., x-direction) and is spaced apart from the tunnel diode electrode 106 and from the charge storage electrode 110 along the second direction (e.g., y-direction). The substrate electrode 112 may be formed of any suitable material, and may be, for example, a metal electrode. In some embodiments, the substrate electrode 112 may include one or more of aluminum (Al), tantalum nitride (TaN), and titanium aluminide (TiAl). In some embodiments, the substrate electrode 112 may be a multi-layer structure such as a layered stack of TaN, TiAl, and Al.

An isolation feature such as a shallow trench isolation (STI) 119 may be formed in the substrate 102, and the STI 119 substantially electrically isolates the charge storage and sensing device 50 from adjacent features, such as the first and second access transistors 21, 22. The STI 119 may be formed to surround regions of the substrate 102 on and in which the charge storage device 16 and the sensing device 18 are formed. In some embodiments, the STI 119 includes a trench that extends into the substrate 102, and the trench is filled with a dielectric material, such as an oxide.

Each of the first and second access transistors 21, 22 includes first and second source/drain electrodes 111, 113, which are disposed on the source/drain doped regions 115, and respective gate electrodes 117 that are disposed on respective gate dielectric layers 101.

The first source/drain electrode 111 of the first access transistor 21 is electrically coupled to the write bit line WBL (see FIG. 1), and in some embodiments, the first source/drain electrode 111 of the first access transistor 21 may be formed as part of a same conductive layer as the write bit line WBL. The second source/drain electrode 113 of the first access transistor 21 is electrically coupled to the charge storage electrode 110, and in some embodiments the second source/drain electrode 113 of the first access transistor 21 may be formed as part of a same conductive layer and may include the same materials as the charge storage electrode 110.

The first source/drain electrode 111 of the second access transistor 22 is electrically coupled to the read bit line RBL (see FIG. 1), and in some embodiments, the first source/drain electrode 111 of the second access transistor 22 may be formed as part of a same conductive layer as the read bit line RBL. The second source/drain electrode 113 of the second access transistor 22 is electrically coupled to the tunnel diode electrode 106, and in some embodiments the second source/drain electrode 113 of the second access transistor 22 may be formed as part of a same conductive layer and may include the same materials as the tunnel diode electrode 106.

During operation, charges indicative of data on the write bit line WBL (e.g., a logical "1" or "0") may be stored (e.g., written) in the charge storage device 16 by controlling the first access transistor 21 to conduct (e.g., turning ON the first access transistor 21) by a control voltage on the word line WL. When the first access transistor is ON, the data on the write bit line WBL is communicated to the charge storage structure 108 via the first access transistor 21 and the charge storage electrode 110. The charges may be stored in the charge storage structure 108. The charge storage device 16 may be put in a floating stage once the charges are provided to and stored by the charge storage structure 108, which may preserve the charged state of the charge storage device 16.

The charges stored in the charge storage structure 108 may be read by controlling the second access transistor 22 to conduct (e.g., turning ON the second access transistor 22) by a control voltage on the word line WL, while the charge storage device 16 is maintained in the floating state. When the second access transistor 22 is ON, a read voltage of the read bit line RBL may be applied to the tunnel diode electrode 106 via the second access transistor 22.

The charges stored in the charge storage structure 108 determine the electric field and the minority carrier concentration of the substrate 102, which affects the voltage across the tunnel diode dielectric layer 104. The Schottky barrier height of the sensing device 18 can be modulated by the voltage of the tunnel oxide, and thus, the Schottky barrier height of the sensing device 18 may be varied as a function of the charges stored in the charge storage structure 108. The saturation current of the sensing device 18 is exponentially dependent on the Schottky barrier height. Therefore, the saturation current of the sensing device 18 can change exponentially with the change of the stored charge.

Accordingly, during a read operation, the saturation current of the sensing device 18 is dependent on, and is a function of, the charges stored in the charge storage structure 108. Therefore, the charges stored in the charge storage structure 108, e.g., the data stored in the charge storage structure 108, can be determined (e.g., by readout circuitry or the like coupled to the sensing device 18) based on the saturation current of the sensing device 18.

By applying the read voltage (e.g., a read bias) to the sensing device 18, which is physically separate from the charge storage device 16, while the charge storage device 16 is in a floating state, the charge stored in the charge storage device 16 may be undisturbed during the read process. This is a significant advantage as compared to conventional memory structures in which a read voltage is applied directly to the storage device, which causes losses of the stored charge. Accordingly, embodiments of the present disclosure facilitate improvements in the charge retention and the retention time of a memory cell, and further facilitate improvements in the memory window. Because the charges may be retained for longer periods of time in various embodiments provided herein, and because charge losses are significantly reduced, memory cells including charge storage and sensing devices provided herein, such as the charge storage and sensing device 50, may provide significant advantages in terms of power efficiency, as reduced voltage biases can be utilized during writing and reading of the charge storage and sensing devices.

Figure 3D:
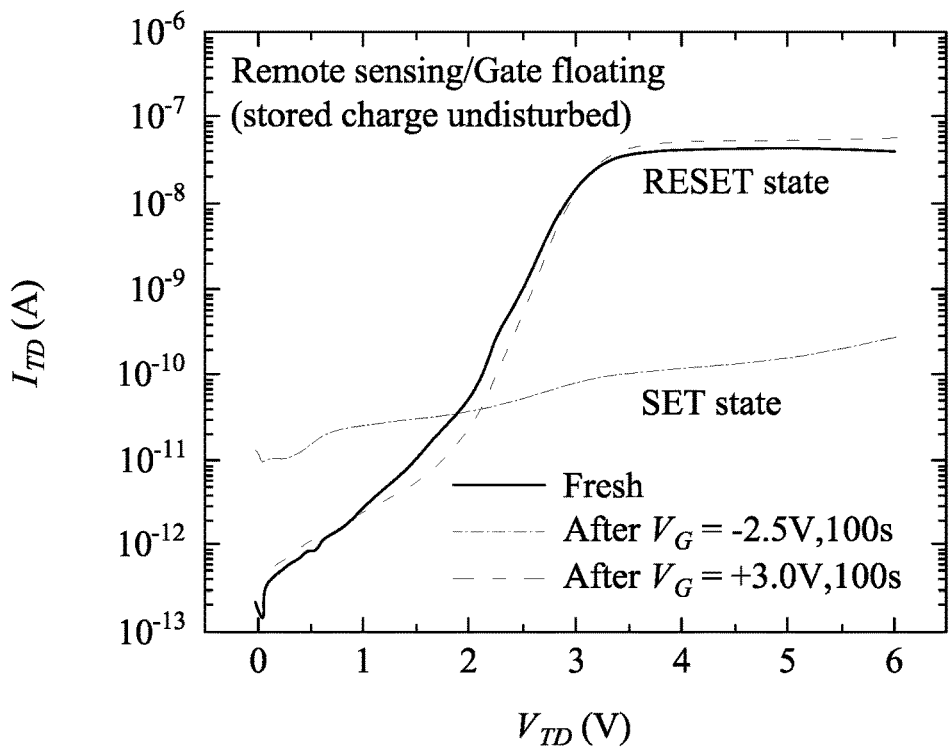
FIGS. 3D through 3F are graphs illustrating characteristics of charge storage and sensing devices, in accordance with some embodiments.
Figure 3E:
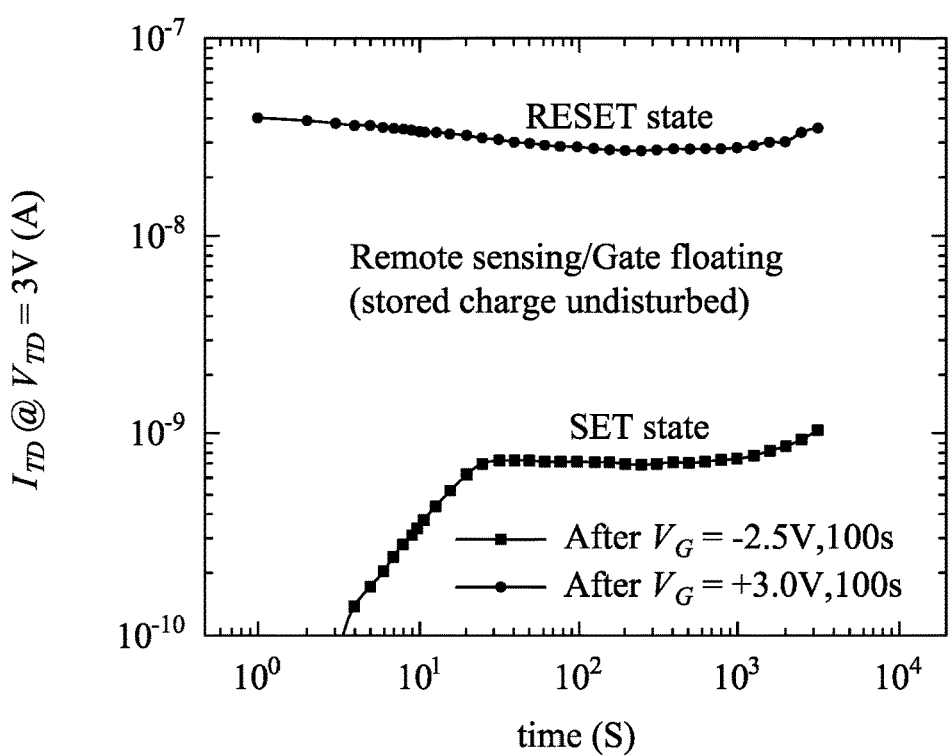
Figure 3F:
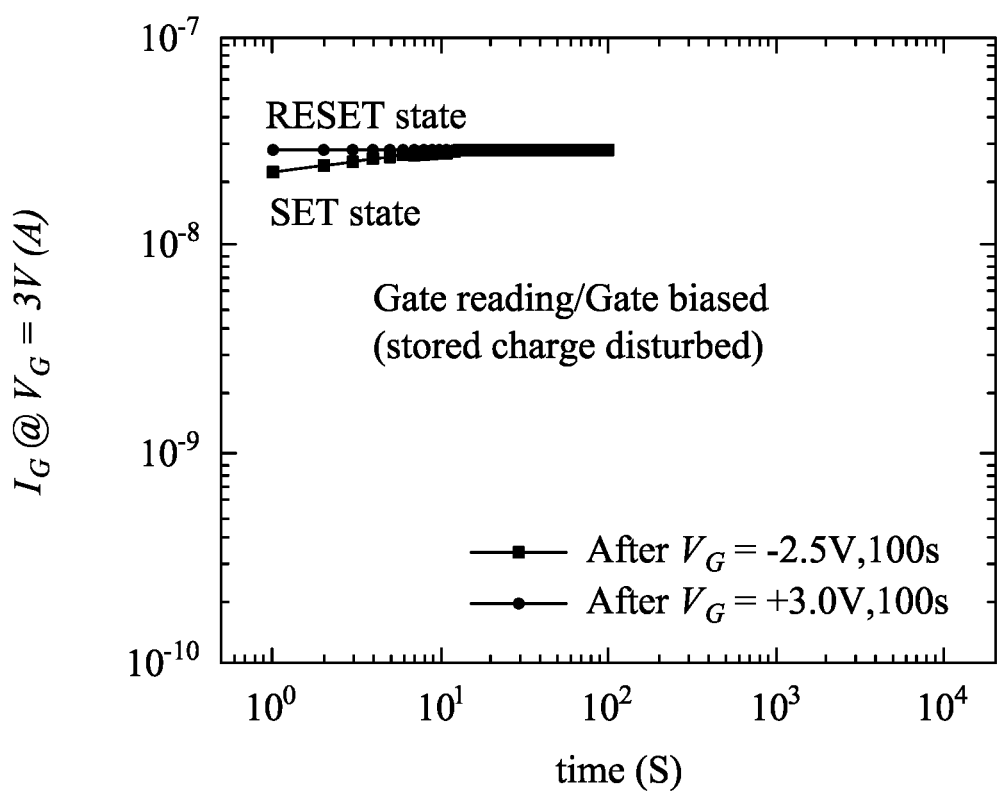

FIGS. 3D through 3F are graphs illustrating characteristics of charge storage and sensing devices provided in various embodiments by the present disclosure, including, for example, the charge storage and sensing device 50.

FIG. 3D is a graph illustrating current-voltage ($I_{TD}$ vs. $V_{TD}$) characteristics of the sensing device 18 measured at fresh, and after application of negative and positive gate voltage stresses (i.e., SET and RESET states of the charge storage device 16). More particularly, the charge storage device 16 may be put in the SET and RESET states by applying different voltages to the charge storage electrode 110. In some embodiments, the charge storage device 16 is put in the SET state by applying a voltage of −2.5V to the charge storage electrode 110 for 100 seconds. In some embodiments, the charge storage device 16 is put in the RESET state by applying a voltage of 3V to the charge storage electrode 110 for 100 seconds. As shown in FIG. 3D, the saturation current ($I_{TD}$) of the sensing device 18 has two distinct states which are set and reset by the negative and positive gate voltages stresses applied to the charge storage electrode 110 of the charge storage device 16.

FIG. 3E is a graph illustrating the charge retention of the charge storage device 16 during reading of the charge storage device 16 by the sensing device 18. More particularly, FIG. 3E shows the current ($I_{TD}$) of the sensing device 18 while reading the charges of the charge storage device 16 in both the SET and the RESET states by applying a voltage of 3V to the tunnel diode electrode 106 of the sensing device 18. As shown in FIG. 3E, the stored charge of the charge storage device 16 is undisturbed during the reading processes, and the SET and RESET states are retained in the charge storage device 16 during reading.

FIG. 3F is a graph illustrating the charge retention of the charge storage device 16 during reading of the charge storage device 16 by applying a read voltage of 3V to the charge storage electrode 110 of the charge storage device 16 for 100 seconds. As shown in FIG. 3F, the gate currents (i.e., the current IG of the charge storage device 16) read during the SET state changes over time to a level that is about the same as the gate currents read during the RESET state. That is, as shown in FIG. 3F, the stored charge is disturbed by application of a voltage to the charge storage electrode 110 of the charge storage device 16.

As can be seen from a comparison of FIGS. 3E and 3F, the charge retention and memory window are significantly improved by structurally separating the read operations from the charge storage device 16, i.e., by remotely reading the charge storage device 16 by the sensing device 18.

Figure 4:
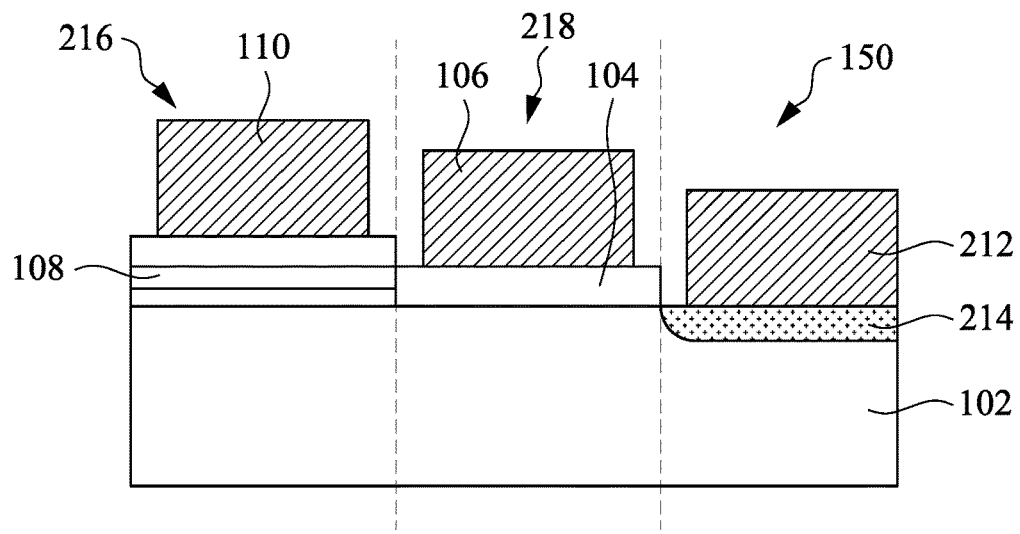
FIG. 4 is a cross-sectional view illustrating a charge storage and sensing device, in accordance with some embodiments.

FIG. 4 is a cross-sectional view illustrating a charge storage and sensing device 150 in accordance with one or more embodiments of the present disclosure.

The charge storage and sensing device 150 is substantially similar to the charge storage and sensing device 50 shown and described with respect to FIGS. 1 through 3C, and may be included in a memory cell, such as the memory cell 10 shown in FIG. 1, and may be electrically coupled to the first and second access transistors 21, 22, the word line WL, the write bit line WBL, and the read bit line RBL, as described previously herein.

A difference between the charge storage and sensing device 150 shown in FIG. 4 and the charge storage and sensing device 50 is that substrate electrode 112 and doped region 114 are positioned adjacent to the sensing device 218, with the sensing device 218 being positioned between the charge storage device 216 and the substrate electrode 212. The substrate electrode 212 is spaced apart from the tunnel diode electrode 106, with the tunnel diode electrode 106 positioned between the charge storage electrode 110 and the substrate electrode 112.

FIGS. 5A to 5H are cross-sectional views illustrating a method of forming a charge storage and sensing device, such as the charge storage and sensing device 150 shown in FIG. 4, in some embodiments.

Figure 5A:
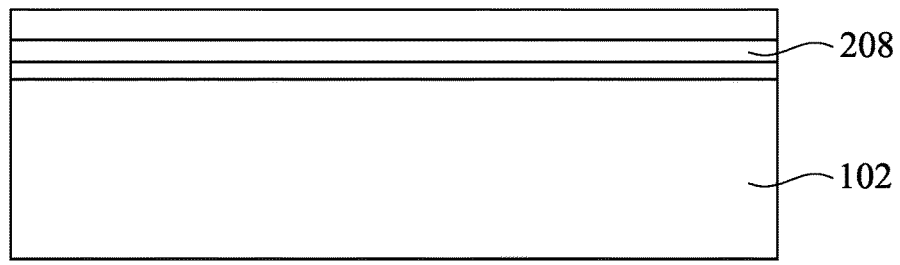
FIGS. 5A to 5H are cross-sectional views illustrating a method of forming a charge storage and sensing device, in accordance with some embodiments.

As shown in FIG. 5A, a charge storage layer 208 is formed on a substrate 102. In some embodiments, the substrate 102 is a silicon substrate; however, embodiments provided herein are not limited thereto. For example, in various embodiments, the substrate 102 may include gallium arsenide (GaAs), gallium nitride (GaN), silicon carbide (SiC), or any other semiconductor material. In some embodiments, the substrate 102 is a p-type substrate having a concentration of p-type dopants, and in other embodiments the substrate 102 is a n-type substrate having a concentration of n-type dopants.

In some embodiments, the charge storage layer 208 is a multi-layer structure. In some embodiments, the charge storage layer 208 includes an oxide-nitride-oxide (ONO) stack. In some embodiments, the charge storage layer 208 includes a first silicon oxide layer (e.g., SiO$_2$), a silicon nitride layer (e.g., Si$_3$N$_4$), and a second silicon oxide layer (e.g., SiO$_2$). In some embodiments, the charge storage layer 208 may have a stacked structure including one or more layers of aluminum oxide (e.g., Al$_2$O$_3$), silicon dioxide (SiO$_2$), and hafnium dioxide (HfO$_2$).

The charge storage layer 208 may be formed by any suitable process, including, for example, deposition, anodization, thermal oxidation, or the like. In some embodiments, the charge storage layer 208 is formed by a deposition process. The deposition process may be any suitable deposition process, including, for example, chemical vapor deposition (CVD), low-pressure chemical vapor deposition (LPCVD), plasma-enhanced chemical vapor deposition (PECVD), plasma vapor deposition (PVD), atomic layer deposition (ALD), or the like.

Figure 5B:
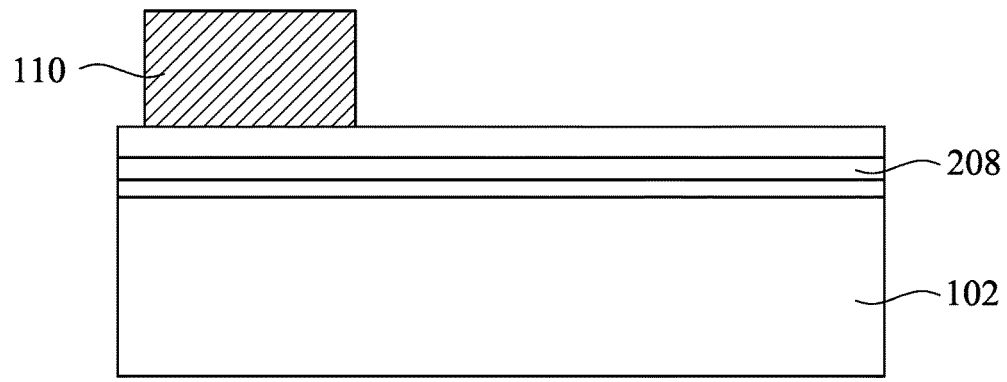

As shown in FIG. 5B, a charge storage electrode 110 is formed on the charge storage layer 208. The charge storage electrode 110 may be formed of any material suitable for use as an electrode, and may be, for example, a metal. The charge storage electrode 110 may be formed by depositing one or more of aluminum (Al), tantalum nitride (TaN), and titanium aluminide (TiAl) on the charge storage layer 208 and patterning the deposited materials to form the charge storage electrode 110. In some embodiments, the charge storage electrode 110 may be formed as a multi-layer structure such as a layered stack of TaN, TiAl, and Al. Such a multi-layer structure may be formed by deposition of TaN, TiAl, and Al, in any order or sequence.

Figure 5C:
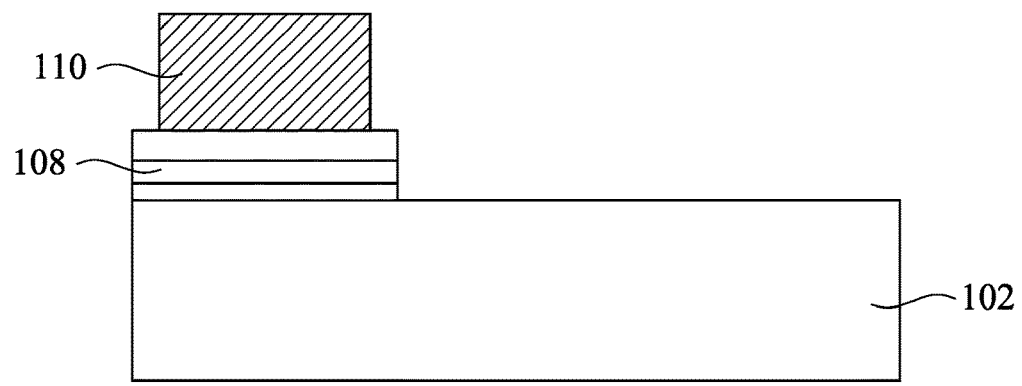

As shown in FIG. 5C, the charge storage structure 108 is formed by removing portions of the charge storage layer 208. The portions of the charge storage layer 208 may be removed by any suitable process, including, for example, by an etching process. In some embodiments, a mask is formed over the charge storage layer 208 and exposes portions of the charge storage layer 208 that will be removed. An etchant may then be utilized to remove the exposed portions of the charge storage layer 208. Any suitable etchant may be utilized, including, for example, any suitable dry etchant or wet etchant such as hydrofluoric acid. The mask may then be removed, leaving the charge storage structure 108 on the substrate 102.

In some embodiments, the charge storage structure 108 is formed to have to have a width that is greater than a width of the charge storage electrode 110. That is, as shown in FIG. 5C, portions of the charge storage structure 108 may extend laterally beyond opposite side surfaces of the charge storage electrode 110. In some embodiments, both the charge storage structure 108 and the charge storage electrode 110 have widths that are within a range of one or more nanometers to one or more micrometers.

Figure 5D:
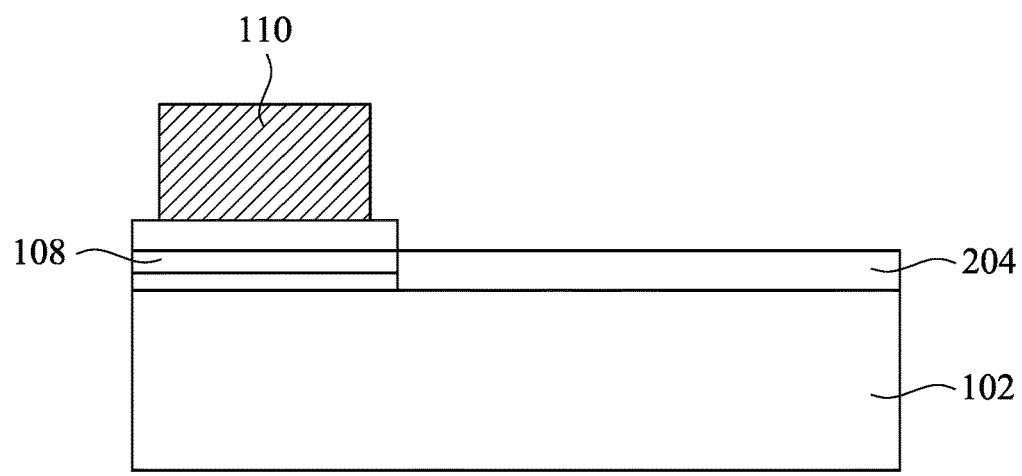

As shown in FIG. 5D, a dielectric layer 204 is formed on the substrate 102 adjacent to and/or in contact with the charge storage structure 108. In some embodiments, the dielectric layer 204 is an oxide layer, such as silicon dioxide (SiO$_2$) or hafnium dioxide (HfO$_2$). In some embodiments, the dielectric layer 204 is a multi-layer structure such as a layered stack of SiO$_2$ and HfO$_2$.

The dielectric layer 204 may be formed by any suitable process, including, for example, deposition, anodization, thermal oxidation, or the like. In some embodiments, the dielectric layer 204 may be formed by a deposition process, including, for example, chemical vapor deposition (CVD), low-pressure chemical vapor deposition (LPCVD), plasma-enhanced chemical vapor deposition (PECVD), plasma vapor deposition (PVD), atomic layer deposition (ALD), or the like.

In some embodiments, the dielectric layer 204 has a thickness that is less than a thickness of the charge storage structure 108, as shown in FIG. 5D. In some embodiments, the dielectric layer 204 contacts the charge storage structure 108, for example, at side surfaces of the charge storage structure 108 and the dielectric layer 204.

Figure 5E:
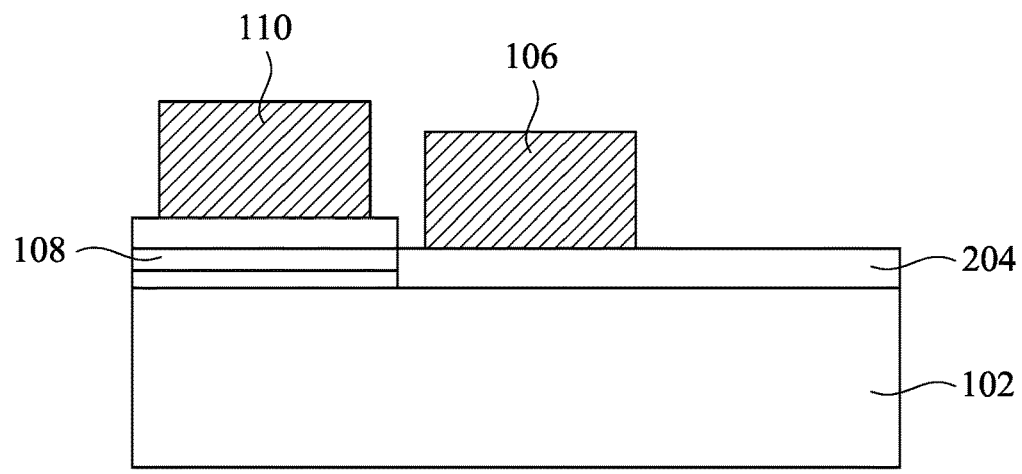

As shown in FIG. 5E, a tunnel diode electrode 106 is formed on the dielectric layer 204. The tunnel diode electrode 106 may be formed of any material suitable for use as an electrode, and may be, for example, a metal. The tunnel diode electrode 106 may be formed by depositing one or more of aluminum (Al), tantalum nitride (TaN), and titanium aluminide (TiAl) on the dielectric layer 204 and patterning the deposited material to form the tunnel diode electrode 106. In some embodiments, the tunnel diode electrode 106 may be formed as a multi-layer structure such as a layered stack of TaN, TiAl, and Al. Such a multi-layer structure may be formed by deposition of TaN, TiAl, and Al, in any order or sequence. In some embodiments, the charge storage electrode 110 and the tunnel diode electrode 106 may be formed by a same process, e.g., by deposition and patterning of the charge storage electrode 110 and the tunnel diode electrode 106.

The tunnel diode electrode 106 is formed to be spaced apart laterally from the charge storage electrode 110. In some embodiments, the tunnel diode electrode 106 is spaced apart from the charge storage electrode 110 by distance that is less than 10 μm. In some embodiments, the tunnel diode electrode 106 is spaced apart from the charge storage electrode 110 by a distance that is less than 100 nm.

Figure 5F:
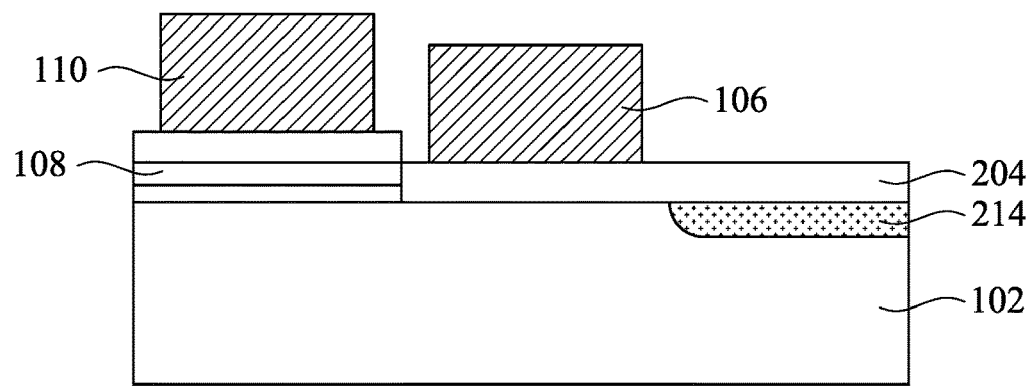
Figure 5G:
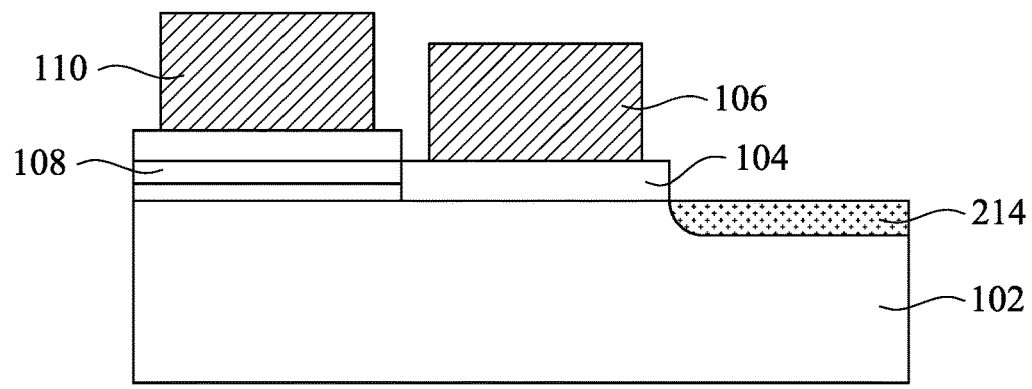

As shown in FIG. 5F, a doped region 214 is formed in the substrate 102. In some embodiments, the doped region 214 is formed by an implantation process in which a dopant species is implanted into the substrate 102. The implanted dopants may have a same conductivity type as the substrate 102. For example, in embodiments where the substrate 102 is a p-type substrate, the doped region 214 includes p-type dopants, and in embodiments where the substrate 102 is a n-type substrate, the doped region 214 includes n-type dopants. The doped region 214 has a higher concentration of the dopants (whether p-type or n-type) than the surrounding portions of the substrate 102. In some embodiments, the dopants may be implanted into the doped region 214 through the dielectric layer 204. In other embodiments, the dopants may be implanted into the doped region 214 after portions of the dielectric layer 204 have been removed to form the tunnel diode dielectric layer 104 (FIG. 5G). The dopants may be implanted through a mask which exposes portions of the dielectric layer 204 and/or the substrate 102 through which the dopants are implanted.

As shown in FIG. 5G, the tunnel diode dielectric layer 104 is formed by removing portions of the dielectric layer 204, for example, by an etching process. In some embodiments, a mask is formed over the dielectric layer 204 and exposes portions of the dielectric layer 204 that will be removed. An etchant may then be utilized to remove the exposed portions of the dielectric layer 204. Any suitable etchant may be utilized, including, for example, any suitable dry etchant or wet etchant such as hydrofluoric acid. The mask may then be removed, leaving the tunnel diode dielectric layer 104 on the substrate 102. The tunnel diode dielectric layer 104 may have a thickness that is less than a thickness of the charge storage structure 108, as shown. In some embodiments, the thickness of the tunnel diode dielectric layer 104 may be less than 10 nm. In some embodiments, the thickness of the tunnel diode dielectric layer 104 is less than 4 nm. In some embodiments, the thickness of the tunnel diode dielectric layer 104 is within a range from 2 nm to 4 nm, inclusive.

Figure 5H:
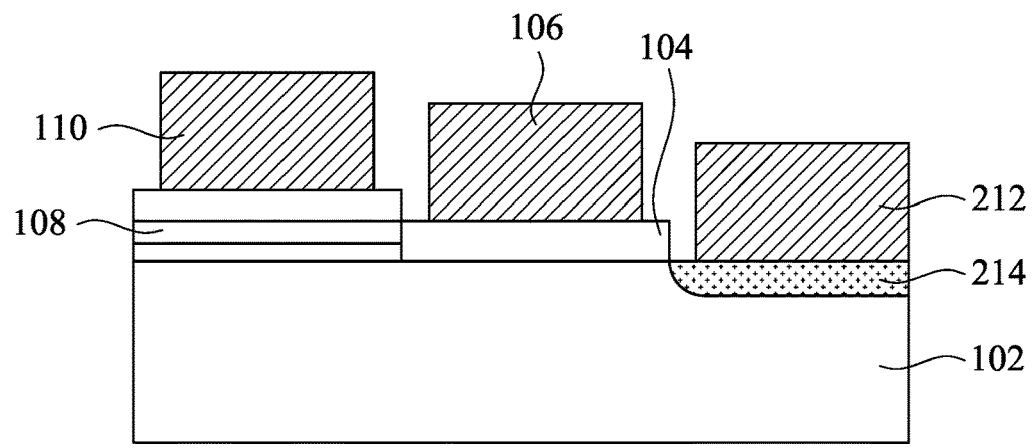

As shown in FIG. 5H, a substrate electrode 212 is formed on the doped region 214. The substrate electrode 212 may be formed of any material suitable for use as an electrode, and may be, for example, a metal. The substrate electrode 212 may be formed, for example, by depositing one or more of aluminum (Al), tantalum nitride (TaN), and titanium aluminide (TiAl) on the doped region 214 and patterning the deposited materials to form the substrate electrode 212. In some embodiments, the substrate electrode 212 may be formed as a multi-layer structure such as a layered stack of TaN, TiAl, and Al. Such a multi-layer structure may be formed by deposition of TaN, TiAl, and Al, in any order or sequence.

The substrate electrode 212 is spaced apart from the tunnel diode electrode 106, with the tunnel diode electrode 106 positioned between the charge storage electrode 110 and the substrate electrode 212.

Figure 6:
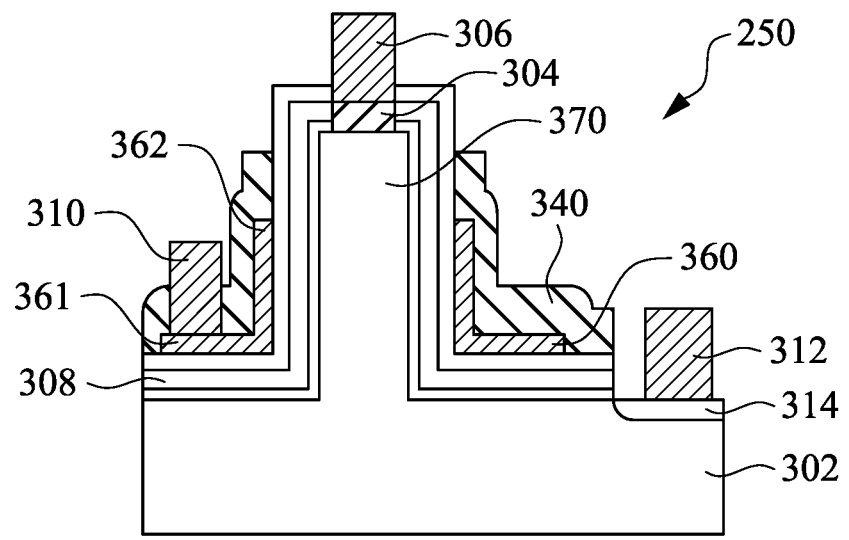
FIG. 6 is a cross-sectional view illustrating a charge storage and sensing device, in accordance with some embodiments.

FIG. 6 is a cross-sectional view illustrating a charge storage and sensing device 250 in accordance with one or more embodiments of the present disclosure. Similar to the charge storage and sensing device 150 shown in FIG. 4 (and similar to the charge storage and sensing device 50) and previously described herein, the charge storage and sensing device 250 includes a charge storage structure for storing electrical charges and a sensing tunnel diode that is operable to read the stored charges based on a change in the saturation current resulting from the electric field generated by the stored charges. However, the device 250 has a different structure than the device 150 of FIG. 5. More specifically, the charge storage and sensing device 250 has a vertical or fin structure.

The device 250 includes a substrate 302, which may be a substrate of any semiconductor material. In some embodiments, the substrate 302 is a silicon substrate; however, embodiments provided herein are not limited thereto. In some embodiments, the substrate 302 is a p-type substrate having a concentration of p-type dopants. In other embodiments, the substrate 302 is a n-type substrate having a concentration of n-type dopants. A doped region 314 is formed in the substrate 302, and in some embodiments the doped region 314 is doped with dopants of the same conductivity type as the substrate 102. The doped region 314 has a higher concentration of the dopants (whether p-type or n-type) than the surrounding portions of the substrate 302.

A semiconductor fin 370 extends outwardly from a surface (e.g., an upper surface, as shown in FIG. 6) of the substrate 302. The fin 370 may be formed of the same material, and may have a same conductivity type, as the substrate 302. In some embodiments, the fin 370 is an extension or protruding portion of the substrate 302.

A charge storage structure 308 is disposed on a surface of the substrate 302 and covers side surfaces of the fin 370, and the charge storage structure 308 may further cover portions of an upper surface of the fin 370. In some embodiments, the charge storage structure 308 may substantially surround the fin 370, with the charge storage structure 308 covering side surfaces and portions of the upper surface of the fin 370. In some embodiments, the charge storage structure 308 is a multi-layer structure. In some embodiments, the charge storage structure 308 includes an oxide-nitride-oxide (ONO) stack. In some embodiments, the charge storage structure 308 includes a first silicon oxide layer (e.g., $SiO_2$), a silicon nitride layer (e.g., $Si_3N_4$), and a second silicon oxide layer (e.g., $SiO_2$). In some embodiments, the charge storage structure 308 may have a stacked structure including one or more layers of aluminum oxide (e.g., $Al_2O_3$), silicon dioxide ($SiO_2$), and hafnium dioxide ($HfO_2$).

A metal layer 360 is disposed on the charge storage structure 308. The metal layer 360 includes a first portion 361 that extends in a first direction (e.g., a horizontal direction as shown in FIG. 6) and a second portion 362 that extends in a second direction (e.g., a vertical direction as shown in FIG. 6) that is transverse to the first direction. The second portion 362 of the metal layer 360 may completely surround sides of a portion of the fin 370. For example, in some embodiments, the second portion 362 of the metal layer 360 surrounds sides of a lower portion of the fin 370, i.e., between an upper surface of the second portion 362 of the metal layer 360 and an upper surface of the substrate 302 from which the fin 370 extends. The second portion 362 of metal layer 360 has an upper surface that is below an upper surface of the fin 370. The metal layer 360 may be formed of any suitable metal. In some embodiments, the metal layer 360 may include one or more of aluminum (Al), tantalum nitride (TaN), and titanium aluminide (TiAl). In some embodiments, the metal layer 360 may be a multi-layer structure such as a layered stack of TaN, TiAl, and Al.

A charge storage electrode 310 is disposed on the metal layer 360. In some embodiments, the charge storage electrode 310 is disposed on the first portion 361 of the metal layer 360, and is spaced apart laterally from the second portion 362 of the metal layer 360. The charge storage electrode 310 may be formed of any material suitable for use as an electrode, and may be, for example, a metal electrode. In various embodiments, the charge storage electrode 310 may include one or more of aluminum (Al), tantalum nitride (TaN), and titanium aluminide (TiAl). In some embodiments, the charge storage electrode 310 may be a multi-layer structure such as a layered stack of TaN, TiAl, and Al.

An isolation dielectric layer 340 is disposed on the metal layer 360. In some embodiments, the isolation dielectric layer 340 abuts side surfaces of the charge storage electrode 310. The isolation dielectric layer 340 may extend over a first edge of the first portion 361 of the metal layer 360, e.g., beyond the left edge of the metal layer 360, as shown in FIG. 6, and may contact the charge storage structure 308. In some embodiments, the isolation dielectric layer 340 extends laterally to a second edge of the first portion 361 of the metal layer 360, e.g., the right edge of the metal layer 360 shown in FIG. 6.

The isolation dielectric layer 340 extends in the second direction (e.g., the vertical direction shown in FIG. 6) over the second portion 362 of the metal layer 360. In some embodiments, the isolation dielectric layer 340 covers an upper surface of the second portion 362 of the metal layer 360 and is in contact with side surfaces of the charge storage structure 308, e.g., along a length of a portion of the fin 370 that extends beyond an upper surface of the second portion 362 of the metal layer 360. The isolation dielectric layer 340 may be any suitable dielectric material, and in some embodiments the isolation dielectric layer 340 may be an oxide.

A tunnel diode dielectric layer 304 is disposed on the upper surface of the fin 370. In some embodiments, the tunnel diode dielectric layer 304 is positioned between, and may be in contact with, portions of the charge storage structure 308 on the upper surface of the fin 370. In some embodiments, the tunnel diode dielectric layer 304 is an oxide layer, such as silicon dioxide ($SiO_2$) or hafnium dioxide ($HfO_2$). In some embodiments, the tunnel diode dielectric layer 304 may be a multi-layer structure such as a layered stack of $SiO_2$ and $HfO_2$. In some embodiments, the thickness of the tunnel diode dielectric layer 304 may be less than 10 nm. In some embodiments, the thickness of the tunnel diode dielectric layer 304 is less than 4 nm.

A tunnel diode electrode 306 is disposed on the tunnel diode dielectric layer 304 over the upper surface of the fin 370. The tunnel diode electrode 306 may be formed of any material suitable for use as an electrode, and may be, for example, a metal electrode. In various embodiments, the tunnel diode electrode 306 may include one or more of aluminum (Al), tantalum nitride (TaN), and titanium aluminide (TiAl). In some embodiments, the tunnel diode electrode 306 may be a multi-layer structure such as a layered stack of TaN, TiAl, and Al. In some embodiments, the tunnel diode electrode 306 and the charge storage electrode 310 may be formed of the same material or materials.

A substrate electrode 312 is disposed on the doped region 314 of the substrate 302. The substrate electrode 312 is spaced apart from the metal layer 360, and in some embodiments, the substrate electrode 312 is positioned opposite the charge storage electrode 310, with the fin 370 and tunnel diode electrode 306 positioned between the substrate electrode 312 and the charge storage electrode 310. In some embodiments, portions of the charge storage structure 308 and the isolation dielectric layer 340 extend between the doped region 314 and a side edge of the metal layer 360.

The substrate electrode 312 may be formed of any suitable material, and may be, for example, a metal electrode. In some embodiments, the substrate electrode 312 may include one or more of aluminum (Al), tantalum nitride (TaN), and titanium aluminide (TiAl). In some embodiments, the substrate electrode 312 may be a multi-layer structure such as a layered stack of TaN, TiAl, and Al.

The charge storage and sensing device 250 operates in a substantially similar manner as described above with respect to the charge storage and sensing devices 50 and 150.

Electrical charges may be stored in the charge storage structure 308, and the charges may be correspond to data, for example, provided from a write bit line (e.g., via an access transistor). After charges are stored, the charge storage electrode 310 may be maintained in a floating state, and the stored charges may be sensed by applying a read voltage to the tunnel diode electrode 306.

FIGS. 7A to 7G are cross-sectional views illustrating a method of forming a charge storage and sensing device, such as the charge storage and sensing device 250 shown in FIG. 6, in some embodiments.

Figure 7A:
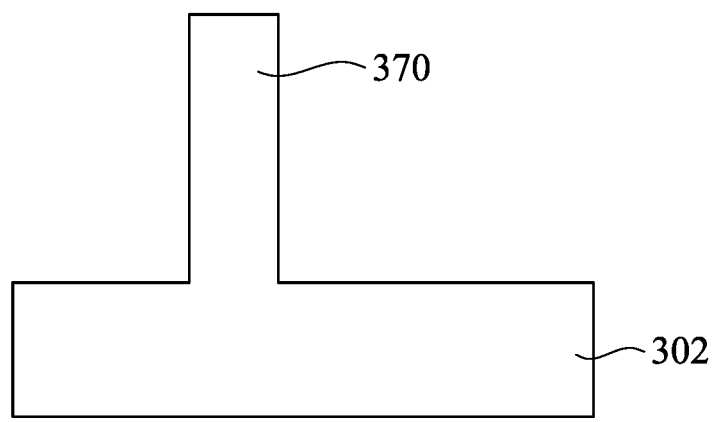
FIGS. 7A to 7G are cross-sectional views illustrating a method of forming a charge storage and sensing device, in accordance with some embodiments.

As shown in FIG. 7A, a fin 370 is formed on a substrate 302. In some embodiments, the fin 370 may be a part of the substrate 302, and may be formed by selectively etching the substrate 302. For example, a mask may be formed over a portion of the substrate 302 which will become the fin 370, and the surrounding portions may be exposed to an etchant that etches into the substrate 302 to form recessed surfaces surrounding the fin 370. The fin 370 may extend outwardly (e.g., in the vertical direction as shown) from the recessed surface of the substrate 302.

Figure 7B:
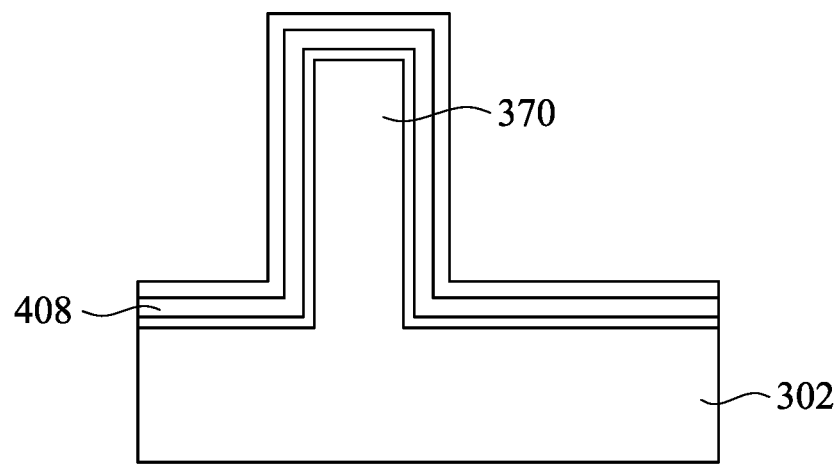

As shown in FIG. 7B, a charge storage layer 408 is formed on the surface of the substrate 302 and on the fin 370. In some embodiments, the charge storage layer 408 may surround the fin 370, with the charge storage layer 408 covering side surfaces and an upper surface of the fin 370.

In some embodiments, the charge storage layer 408 is a multi-layer structure. In some embodiments, the charge storage layer 408 includes an oxide-nitride-oxide (ONO) stack. In some embodiments, the charge storage layer 408 includes a first silicon oxide layer (e.g., $SiO_2$), a silicon nitride layer (e.g., $Si_3N_4$), and a second silicon oxide layer (e.g., $SiO_2$). In some embodiments, the charge storage layer 408 may have a stacked structure including one or more layers of aluminum oxide (e.g., $Al_2O_3$), silicon dioxide ($SiO_2$), and hafnium dioxide ($HfO_2$).

The charge storage layer 408 may be formed by any suitable process, including, for example, deposition, anodization, thermal oxidation, or the like. In some embodiments, the charge storage layer 408 is formed by a deposition process.

Figure 7C:
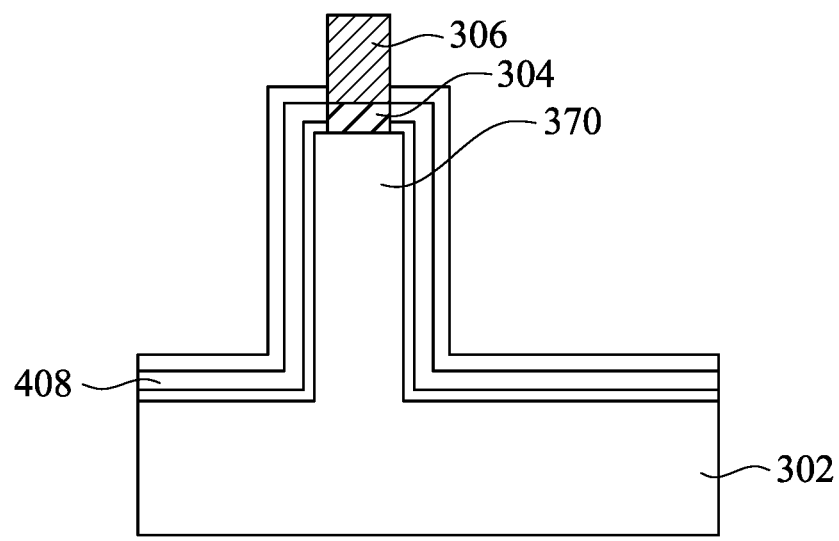

As shown in FIG. 7C, portions of the charge storage layer 408 are removed from an upper surface of the fin 370, e.g., by an etching process or any other suitable technique, thereby exposing at least a portion of the upper surface of the fin 370. A tunnel diode dielectric layer 304 is formed on the exposed portion of the upper surface of the fin 370, and in some embodiments, the tunnel diode dielectric layer 304 abuts side surfaces of the charge storage layer 408. In some embodiments, the tunnel diode dielectric layer 304 is an oxide layer, such as silicon dioxide ($SiO_2$) or hafnium dioxide ($HfO_2$). In some embodiments, the tunnel diode dielectric layer 304 may be a multi-layer structure such as a layered stack of $SiO_2$ and $HfO_2$. The tunnel diode dielectric layer 304 may be formed by any suitable process, including, for example, deposition, anodization, thermal oxidation, or the like. In some embodiments, the tunnel diode dielectric layer 304 is formed by a deposition process. In some embodiments, the thickness of the tunnel diode dielectric layer 304 is less than the thickness of the charge storage layer 408. In some embodiments, the thickness of the tunnel diode dielectric layer 304 may be less than 10 nm, and in some embodiments, the thickness of the tunnel diode dielectric layer 304 is less than 4 nm.

A tunnel diode electrode 306 is formed on the tunnel diode dielectric layer 304 over the upper surface of the fin 370. The tunnel diode electrode 306 may be spaced apart from the metal layer 360 by portions of the charge storage layer 408 and/or the isolation dielectric layer 340.

The tunnel diode electrode 306 may be formed of any material suitable for use as an electrode, and may be, for example, a metal electrode. The tunnel diode electrode 306 may be formed, for example, by deposition. In some embodiments, the tunnel diode electrode 306 includes one or more of aluminum (Al), tantalum nitride (TaN), and titanium aluminide (TiAl). In some embodiments, the tunnel diode electrode 306 may be formed as a multi-layer structure such as a layered stack of TaN, TiAl, and Al. Such a multi-layer structure may be formed by deposition of TaN, TiAl, and Al, in any order or sequence.

Figure 7D:
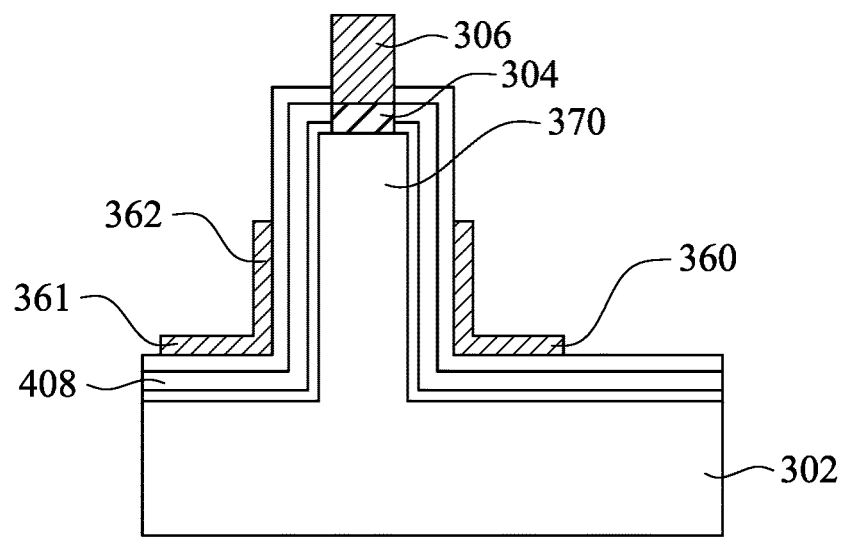

As shown in FIG. 7D, a metal layer 360 is formed on the charge storage layer 408. The metal layer 360 includes a first portion 361 that extends in a first direction (e.g., a horizontal direction as shown) and a second portion 362 that extends in a second direction (e.g., a vertical direction as shown) that is transverse to the first direction. The metal layer 360 may be formed of any suitable metal. The metal layer 360 may be formed by depositing one or more of aluminum (Al), tantalum nitride (TaN), and titanium aluminide (TiAl) on the charge storage layer 408 and patterning the deposited materials to form the metal layer 360. In some embodiments, the metal layer 360 may be formed as a multi-layer structure such as a layered stack of TaN, TiAl, and Al. Such a multi-layer structure may be formed by deposition of TaN, TiAl, and Al, in any order or sequence.

Figure 7E:
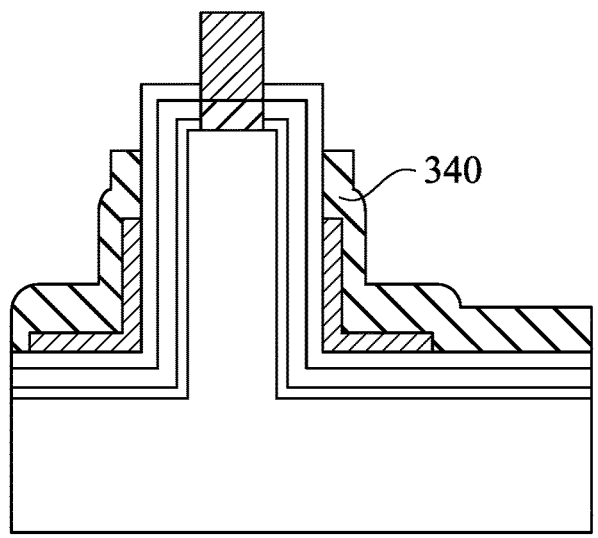

As shown in FIG. 7E, an isolation dielectric layer 340 is formed over the metal layer 360. In some embodiments, the isolation dielectric layer 340 is formed to extend over edges of the first portion 361 of the metal layer 360, e.g., over the left and right edges of the metal layer 360, as shown in FIG. 7E. The isolation dielectric layer 340 contacts the charge storage layer 408 beyond the side edges of the first portion 361 of the metal layer 360. The isolation dielectric layer 340 extends in the second direction (e.g., the vertical direction as shown) over the second portion 362 of the metal layer 360, and may cover an upper surface of the second portion 362 of the metal layer 360 and may further cover part of the side surfaces of the charge storage layer 408 along a length of a portion of the fin 370 that extends beyond an upper surface of the second portion 362 of the metal layer 360. The isolation dielectric layer 340 may be formed of any suitable dielectric material, and in some embodiments the isolation dielectric layer 340 may be an oxide.

In some embodiments, the isolation dielectric layer 340 is formed by deposition of a dielectric material. In some embodiments, the isolation dielectric layer 340 is formed by depositing a dielectric material over some or all of the structure shown in FIG. 7D, and then selectively removing portions of the deposited dielectric material to form the isolation dielectric layer 340.

Figure 7F:
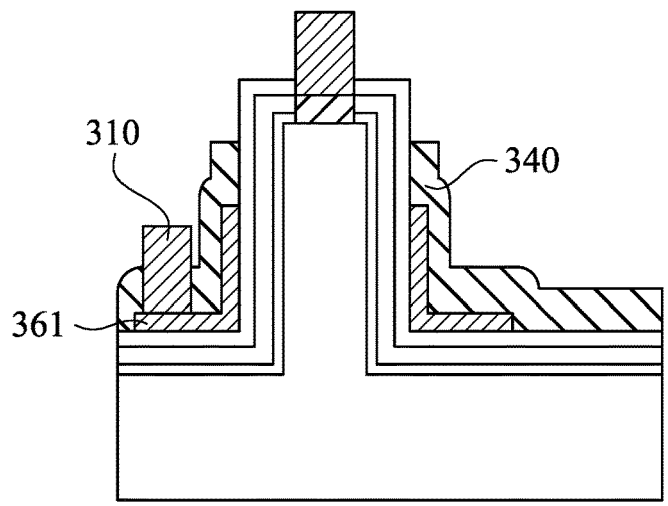

As shown in FIG. 7F, a charge storage electrode 310 is formed on the metal layer 360. The charge storage electrode 310 may be formed of any material suitable for use as an electrode, and may be, for example, a metal. In some embodiments, a portion of the isolation dielectric layer 340 is removed (e.g., by an etching process or any other suitable technique) to expose part of the first portion 361 of the metal layer 360, and the charge storage electrode 310 is formed on and in contact with the exposed part of the first portion 361 of the metal layer 360. The charge storage electrode 310 may be formed, for example, by deposition. In some embodiments, the charge storage electrode 310 includes one or more of aluminum (Al), tantalum nitride (TaN), and titanium aluminide (TiAl). In some embodiments, the charge storage electrode 310 may be formed as a multi-layer structure such as a layered stack of TaN, TiAl, and Al. Such a multi-layer structure may be formed by deposition of TaN, TiAl, and Al, in any order or sequence. In some embodiments, the isolation dielectric layer 340 abuts side surfaces of the charge storage electrode 310.

Figure 7G:
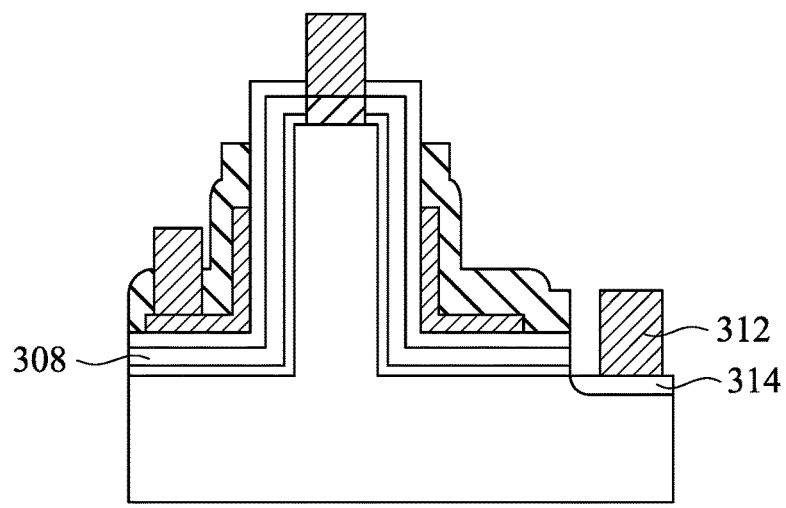

As shown in FIG. 7G, a charge storage structure 308 is formed, for example, by selectively removing portions of the charge storage layer 408, a doped region 314 is formed in the substrate 302, and a substrate electrode 312 is formed on the doped region 314.

In some embodiments, the doped region 314 is formed by an implantation process in which a dopant species is implanted into the substrate 302. The implanted dopants may have a same conductivity type as the substrate 302. The doped region 314 has a higher concentration of the dopants (whether p-type or n-type) than the surrounding portions of the substrate 302. In some embodiments, the dopants may be implanted into the doped region 314 through the charge storage layer 408 and/or the isolation dielectric layer 340, and portions of the charge storage layer 408 and/or the isolation dielectric layer 340 may be selectively removed to expose a surface of the doped region 314. In other embodiments, the dopants may be implanted into the doped region 314 after portions of the charge storage layer 408 and the isolation dielectric layer 340 have been removed to expose the surface of the substrate 302 into which the dopants are implanted.

The substrate electrode 312 is formed on the doped region 314. The substrate electrode 312 may be formed of any material suitable for use as an electrode, and may be, for example, a metal. The substrate electrode 312 may be formed, for example, by depositing one or more of aluminum (Al), tantalum nitride (TaN), and titanium aluminide (TiAl) on the doped region 314 and patterning the deposited materials to form the substrate electrode 312. In some embodiments, the substrate electrode 312 may be formed as a multi-layer structure such as a layered stack of TaN, TiAl, and Al. Such a multi-layer structure may be formed by deposition of TaN, TiAl, and Al, in any order or sequence.

In some embodiments, two or more of the substrate electrode 312, the charge storage electrode 310, and the tunnel diode electrode 306 may be formed of the same material or materials. In some embodiments, two or more of the substrate electrode 312, the charge storage electrode 310, and the tunnel diode electrode 306 may be formed by a same process, e.g., by deposition and patterning of the substrate electrode 312, the charge storage electrode 310, and the tunnel diode electrode 306.

FIGS. 8 through 17 are top plan views illustrating various layouts of charge storage and sensing devices in accordance with embodiments of the present disclosure. Each of the devices illustrated in FIGS. 8 through 17 operates in a similar manner as described herein with respect to the charge storage and sensing device 50 shown in FIGS. 1 through 3C, the charge storage and sensing device 150 shown in FIG. 4, and the charge storage and sensing device 250 shown in FIG. 6. More particularly, the charge storage and sensing devices illustrated in FIGS. 8 through 17 include charge storage structures in which electrical charges may be stored and a sensing device structure which is operable to sense the stored charges by applying a read voltage to the tunnel diode electrode.

Each of the devices illustrated in FIGS. 8 through 17 includes a charge storage electrode and a tunnel diode electrode which are spaced apart from one another by a distance. In some embodiments, the distance between the charge storage electrode and the tunnel diode electrode is within a range from several micrometers to several angstroms, inclusive. In some embodiments, the distance between the charge storage electrode and the tunnel diode electrode is less than 10 µm. In some embodiments, the distance between the charge storage electrode and the tunnel diode electrode is less than 100 nm. Furthermore, each of the devices illustrated in FIGS. 8 through 17 may include any of the features described herein, including, for example, any of the features described herein with respect to the charge storage and sensing devices 50, 150, and/or 250.

In various embodiments of the devices shown in one or more of FIGS. 8 through 17, the tunnel diode electrode and the charge storage electrode may have dimensions (including, for example, width, length, and thickness dimensions) within a range from several hundreds of micrometers to several nanometers, inclusive.

Figure 8:
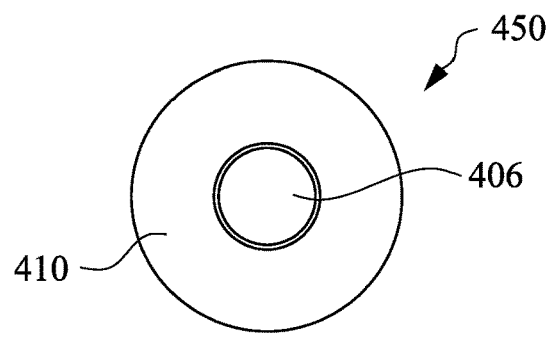
FIG. 8 is a top plan view illustrating a device having a charge storage electrode that laterally surrounds a tunnel diode electrode, in accordance with some embodiments.

FIG. 8 is a top plan view illustrating a device 450 which includes a tunnel diode electrode 406, and a charge storage electrode 410 that laterally surrounds the tunnel diode electrode 406. The tunnel diode electrode 406 may have a substantially circular shape in top plan view. The charge storage electrode 410 may have a substantially ring shape in top plan view.

The tunnel diode electrode 406 and the charge storage electrode 410 may be formed on a substrate, which may be substantially the same, for example, as any of the substrates of any of the charge storage and sensing devices described herein. Similarly, the device 450 may include one or more of the features of the charge storage and sensing devices described herein. For example, in various embodiments, the device 450 may include a doped region, a tunnel diode dielectric layer (which may be positioned between the substrate and the tunnel diode electrode 406), and a charge storage structure (which may be positioned between the substrate and the charge storage electrode 410). In some embodiments, the device 450 includes a substrate electrode (not shown) which may be substantially the same as any of the substrate electrodes described herein. In some embodiments, the substrate electrode may be provided on a doped region and spaced apart from the charge storage electrode 410, with the charge storage electrode 410 positioned between the tunnel diode electrode 406 and the substrate electrode.

In some embodiments, the device 450 may have a vertical or fin structure and may include one or more of the features of the device 350 shown in FIG. 6. For example, the tunnel diode electrode 406 may be disposed over a semiconductor fin, while the charge storage electrode 410 may be disposed on a surface of the substrate.

Figure 9:
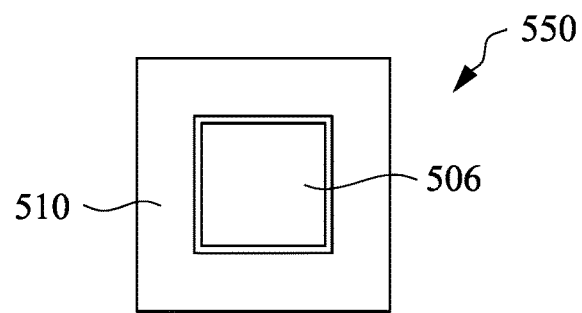
FIG. 9 is a top plan view illustrating a device having a charge storage electrode that laterally surrounds a tunnel diode electrode, in accordance with some embodiments.

FIG. 9 is a top plan view illustrating a device 550 which includes a tunnel diode electrode 506, and a charge storage electrode 510 that laterally surrounds the tunnel diode electrode 506. The device 550 shown in FIG. 9 is substantially the same as the device 450 shown in FIG. 8, except that in the device 550, the tunnel diode electrode 506 has a substantially rectangular shape in top plan view. The charge storage electrode 510 has a substantially rectangular inner perimeter in top plan view which is adjacent to, and spaced apart from, the tunnel diode electrode 506. An outer perimeter of the charge storage electrode 510 similarly has a substantially rectangular shape in top plan view.

Figure 10:
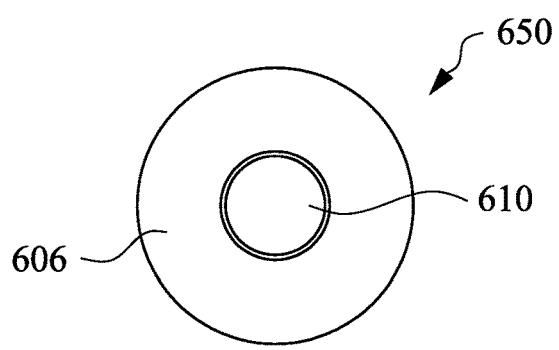
FIG. 10 is a top plan view illustrating a device having a tunnel diode electrode that laterally surrounds a charge storage electrode, in accordance with some embodiments.

FIG. 10 is a top plan view illustrating a device 650 which includes a charge storage electrode 610, and a tunnel diode electrode 606 that laterally surrounds the charge storage electrode 610. The device 650 shown in FIG. 10 is substantially the same as the device 450 shown in FIG. 8, except that the positions of the charge storage electrode 610 and the tunnel diode electrode 606 are reversed with respect to the charge storage electrode 410 and the tunnel diode electrode 406 of the device 450.

Figure 11:
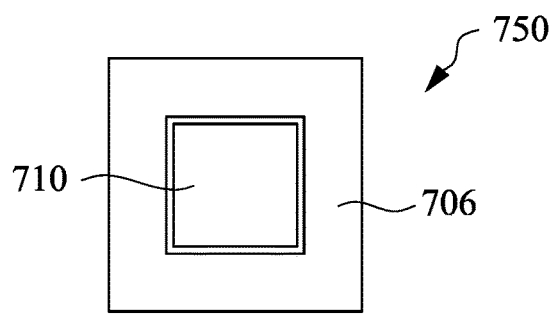
FIG. 11 is a top plan view illustrating a device having a tunnel diode electrode that laterally surrounds a charge storage electrode, in accordance with some embodiments.

FIG. 11 is a top plan view illustrating a device 750 which includes a charge storage electrode 710, and a tunnel diode electrode 706 that laterally surrounds the charge storage electrode 610. The device 750 shown in FIG. 11 is substantially the same as the device 550 shown in FIG. 9, except that the positions of the charge storage electrode 710 and the tunnel diode electrode 706 are reversed with respect to the charge storage electrode 510 and the tunnel diode electrode 506 of the device 550.

Figure 12:
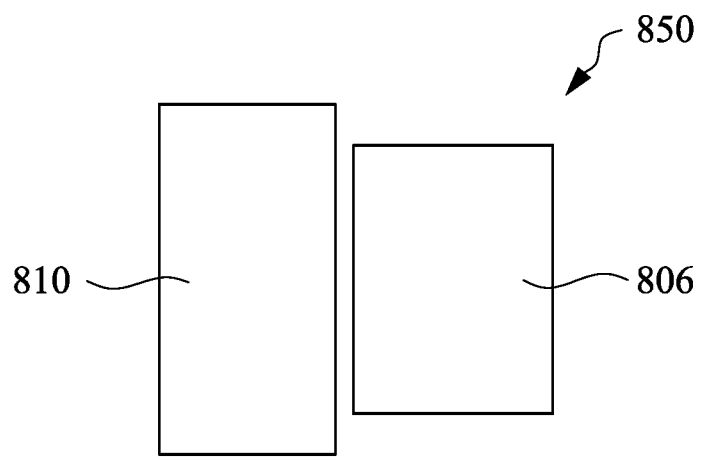
FIG. 12 is a top plan view illustrating a device having a charge storage electrode and a tunnel diode electrode provided in a parallel layout, in accordance with some embodiments.

FIG. 12 is a top plan view illustrating a device 850 which includes a charge storage electrode 810 and a tunnel diode electrode 806 provided in a parallel layout. The charge storage electrode 810 and the tunnel diode electrode 806 may have substantially rectangular shapes in top plan view, and may be spaced apart from one another as shown. In some embodiments, the size and shape of the charge storage electrode 810 and the tunnel diode electrode 806 may be different from each other.

Figure 13:
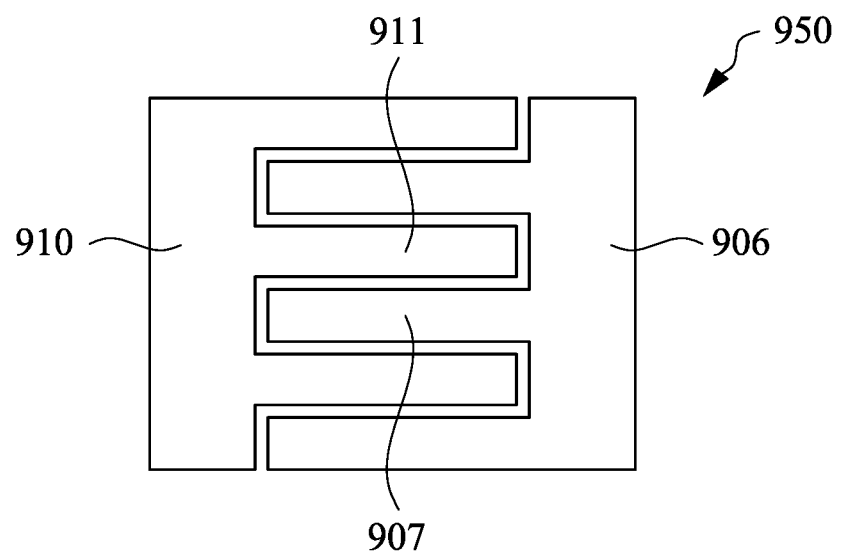
FIG. 13 is a top plan view illustrating a device having a charge storage electrode and a tunnel diode electrode provided in a "fingers" layout, in accordance with some embodiments.

FIG. 13 is a top plan view illustrating a device 950 which includes a charge storage electrode 910 and a tunnel diode electrode 906 provided in a "fingers" layout. The charge storage electrode 910 includes a plurality of extending portions or fingers 911 that extend from a body of the charge storage electrode 910. Similarly, the tunnel diode electrode 906 includes a plurality of extending portions or fingers 907 that extend from a body of the tunnel diode electrode 906. The fingers 911 of the charge storage electrode 910 extend toward the body of the tunnel diode electrode 906, while the fingers 907 of the tunnel diode electrode 906 extend toward the body of the charge storage electrode 910. The fingers 911 of the charge storage electrode 910 and the fingers 907 of the tunnel diode electrode 906 are alternately arranged, in top plan view, between the body of the charge storage electrode 910 and the body of the tunnel diode electrode 906.

Figure 14:
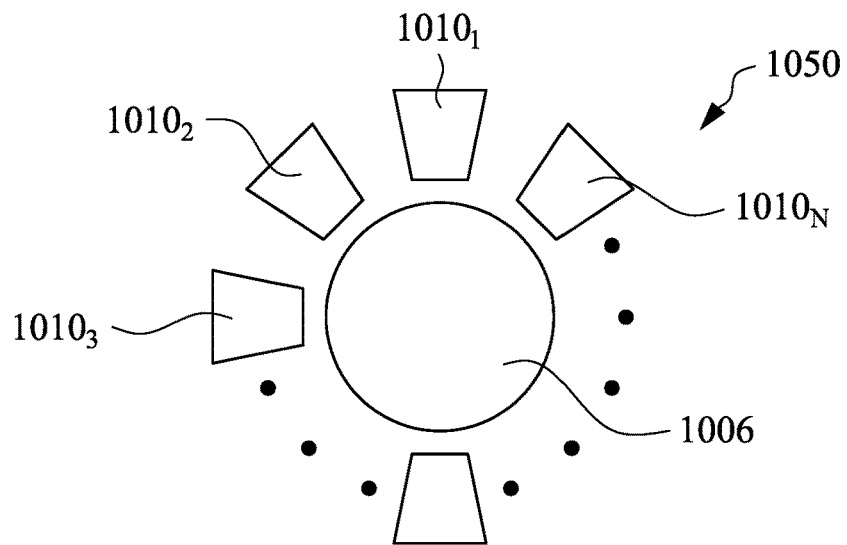
FIG. 14 is a top plan view illustrating a device having a multi-charge storage electrode layout, in accordance with some embodiments.

FIG. 14 is a top plan view illustrating a device 1050 which has a multi-charge storage electrode layout (which may be referred to as a multi-gate layout). More specifically, the device 1050 includes a tunnel diode electrode 1006, and a plurality of charge storage electrodes $1010_1$ through $1010_N$ that are provided around the tunnel diode electrode 1006 in top plan view. The tunnel diode electrode 1006 may have a substantially circular shape in top plan view, as shown; however, embodiments are not limited thereto. In some embodiments, the tunnel diode electrode 1006 may have any non-circular shape in top plan view, including, for example, a rectangular shape, square shape, polygonal shape, or any other shape.

The charge storage electrodes $1010_1$ through $1010_N$ may substantially surround the tunnel diode electrode 1006, with adjacent ones of the charge storage electrodes $1010_1$ through $1010_N$ being spaced apart from one another.

Figure 15:
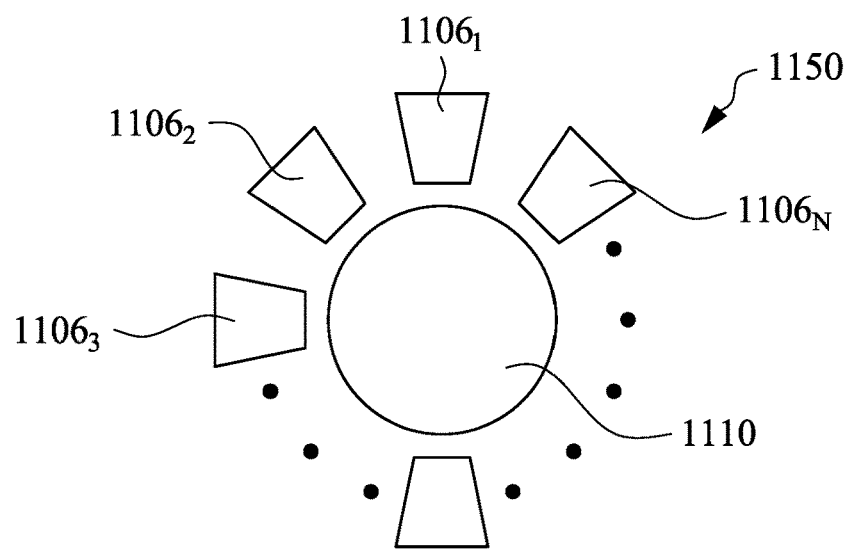
FIG. 15 is a top plan view illustrating a device having a multi-tunnel diode electrode layout, in accordance with some embodiments.

FIG. 15 is a top plan view illustrating a device 1150 having a multi-gate layout. The device 1150 shown in FIG. 15 is substantially the same as the device 1050 shown in FIG. 14, except that the positions of the charge storage electrode and the tunnel diode electrode are reversed in the device 1150 with respect to the charge storage electrode and the tunnel diode electrode of the device 1050. More specifically, the device 1150 includes a charge storage electrode 1110 and a plurality of tunnel diode electrodes $1106_1$ through $1106_N$ that are provided around the charge storage electrode 1110 in top plan view. The charge storage electrode 1110 may have a substantially circular shape in top plan view, as shown; however, embodiments are not limited thereto. In some embodiments, the charge storage electrode 1110 may have any non-circular shape in top plan view, including, for example, a rectangular shape, square shape, polygonal shape, or any other shape.

The tunnel diode electrodes $1106_1$ through $1106_N$ may substantially surround the charge storage electrode 1110, with adjacent ones of the tunnel diode electrodes $1106_1$ through $1106_N$ being spaced apart from one another.

Figure 16:
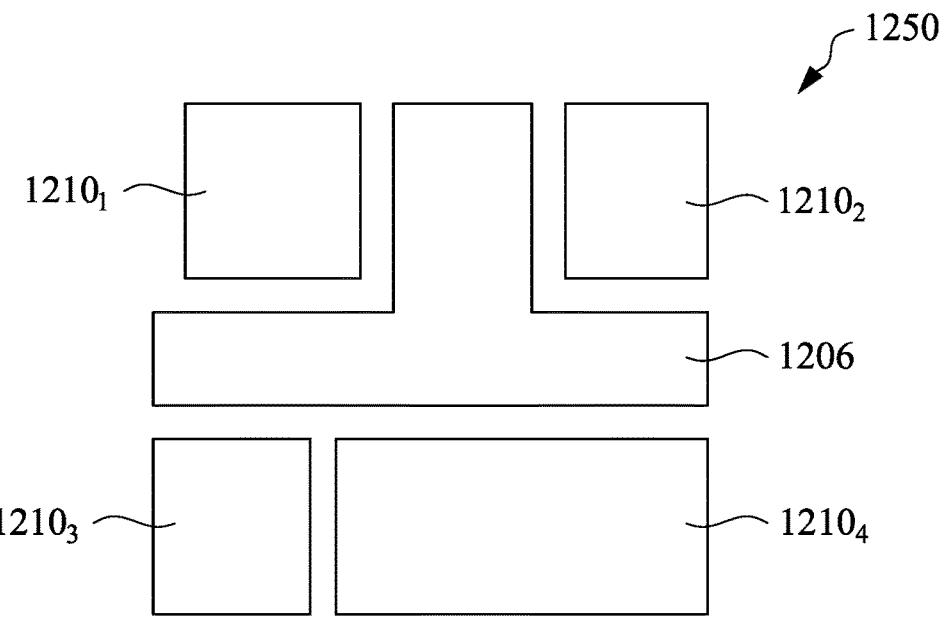
FIG. 16 is a top plan view illustrating a device having a multi-charge storage electrode layout, in accordance with some embodiments.

FIG. 16 is a top plan view illustrating a device 1250 having a multi-gate layout. The device 1250 includes a tunnel diode electrode 1206 that includes a first portion which extends in a first direction, and a second portion that extends in a second direction that is transverse to the first direction. Charge storage electrodes $1210_1$ through $1210_4$ are adjacent to the tunnel diode electrode 1206 at various different positions. As shown in FIG. 16, the device 1250 may include four charge storage electrodes $1210_1$ through $1210_4$; however, embodiments are not limited thereto. Any number of charge storage electrodes may be included in the device 1250 and spaced apart from the tunnel diode electrode 1206. In some embodiments, the charge storage electrodes $1210_1$ through $1210_4$ have various different sizes and shapes.

Figure 17:
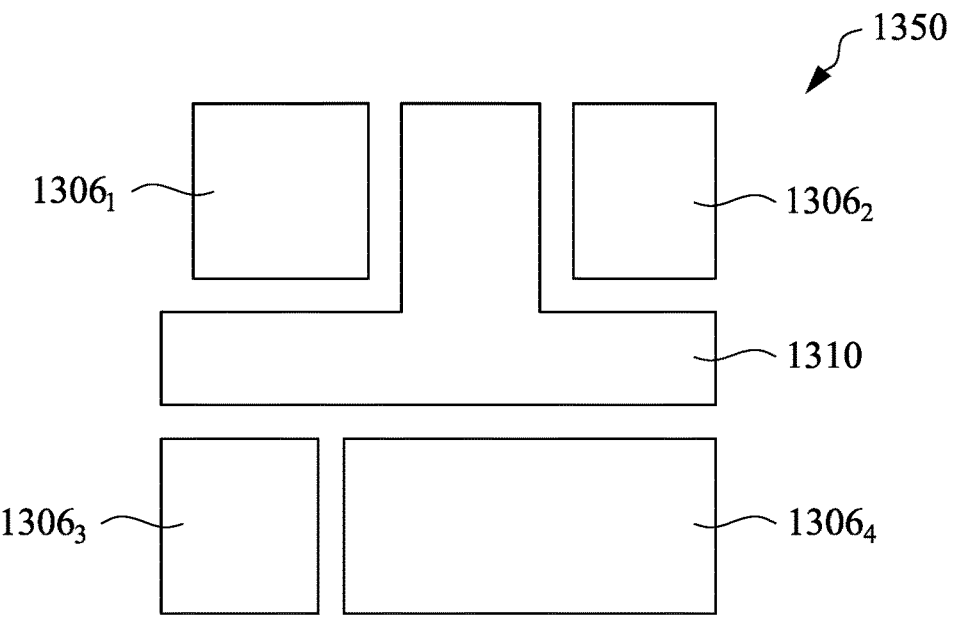
FIG. 17 is a top plan view illustrating a device having a multi-tunnel diode electrode layout, in accordance with some embodiments.

FIG. 17 is a top plan view illustrating a device 1350 having a multi-tunnel diode electrode structure. The device 1350 shown in FIG. 17 is substantially the same as the device 1250 shown in FIG. 16, except that the charge storage electrode and the tunnel diode electrode are reversed in the device 1350 with respect to the charge storage electrode and the tunnel diode electrode of the device 1250. More specifically, the device 1350 includes a charge storage electrode

1310 that includes a first portion which extends in a first direction, and a second portion that extends in a second direction that is transverse to the first direction. Tunnel diode electrodes 1306₁ through 1306₄ are adjacent to the charge storage electrode 1310 at various different positions. As shown in FIG. 17, the device 1350 may include four tunnel diode electrodes 1306₁ through 1306₄; however, embodiments are not limited thereto. Any number of tunnel diode electrodes may be included in the device 1350 and spaced apart from the charge storage electrode 1310.

The present disclosure provides, in various embodiments, charge storage and sensing devices having a tunnel diode that is capable of sensing charges stored in a charge storage structure. The devices may be included in a memory cell. The Schottky barrier height of the tunnel diode is variable based on the charges stored in the charge storage structure, and thus, the saturation current of the tunnel diode varies in dependence with variations of the stored charge. The tunnel diode can therefore be used to sense the charges stored in the charge storage structure, without disturbing the charges in the charge storage structure. This results in increased charge retention and charge retention time in the charge storage structure.

According to one embodiment, a device includes a substrate having a doped region. A charge storage device and a tunnel diode device are disposed adjacent to one another on the substrate. The tunnel diode includes a tunnel diode dielectric layer on the substrate, and a tunnel diode electrode on the tunnel diode dielectric layer. A substrate electrode is disposed on the doped region of the substrate, and the tunnel diode electrode is positioned between the charge storage device and the substrate electrode.

According to another embodiment, a method is provided that includes forming a charge storage structure on a substrate. A charge storage electrode is formed on the charge storage structure. A tunnel diode dielectric layer is formed on the substrate. A tunnel diode electrode is formed on the tunnel diode dielectric layer. A doped region is formed in the substrate, with the tunnel diode electrode positioned between the charge storage electrode and the doped region. A substrate electrode is formed on the doped region.

According to yet another embodiment, a memory structure includes a charge storage device and a charge sensing device adjacent to the charge storage device. A first transistor has source and drain electrodes electrically coupled between the charge storage device and a write bit line, and a gate terminal electrically coupled to a word line. A second transistor has source and drain electrodes electrically coupled between the charge sensing device and a read bit line, and a gate terminal electrically coupled to the word line.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
a substrate;
a charge storage device on the substrate, the charge storage device including:
a charge storage structure on the substrate, and
a charge storage electrode on the charge storage structure; and
a tunnel diode on the substrate adjacent to the charge storage device, the tunnel diode including:
a tunnel diode dielectric layer on the substrate, and
a tunnel diode electrode on the tunnel diode dielectric layer,
wherein one of the charge storage electrode or the tunnel diode electrode laterally surrounds a periphery of the other of the charge storage electrode or the tunnel diode electrode.

2. The device of claim 1 wherein the charge storage structure includes a first oxide layer, a nitride layer on the first oxide layer, and a second oxide layer on the nitride layer.

3. The device of claim 1 wherein the tunnel diode dielectric layer has a thickness that is equal to or less than 4 nm, and the charge storage structure has a thickness that is greater than the thickness of the tunnel diode dielectric layer.

4. The device of claim 1 wherein the charge storage electrode is a multi-layer structure including tantalum nitride (TaN), titanium aluminide (TiAl), and aluminum (Al).

5. The device of claim 4 wherein the tunnel diode electrode is a multi-layer structure including tantalum nitride (TaN), titanium aluminide (TiAl), and aluminum (Al).

6. The device of claim 1 wherein the charge storage electrode is spaced apart from the tunnel diode electrode by a distance equal to or less than 100 nm.

7. The device of claim 1 wherein the charge storage electrode has a substantially circular shape, and the tunnel diode electrode completely laterally surrounds a periphery of the charge storage electrode.

8. The device of claim 7 wherein the tunnel diode electrode includes a plurality of electrodes spaced apart from one another and adjacent to the periphery of the charge storage electrode.

9. The device of claim 1 wherein the tunnel diode electrode has a substantially circular shape, and the charge storage electrode completely laterally surrounds a periphery of the tunnel diode electrode.

10. The device of claim 9 wherein the charge storage electrode includes a plurality of electrodes spaced apart from one another and adjacent to the periphery of the tunnel diode electrode.

11. The device of claim 1 wherein the tunnel diode electrode has a substantially rectangular shape, and the charge storage electrode completely laterally surrounds the periphery of the tunnel diode electrode.

12. The device of claim 1 wherein the charge storage electrode has a substantially rectangular shape, and the tunnel diode electrode completely laterally surrounds the periphery of the charge storage electrode.

13. A method, comprising:
forming a charge storage structure on a substrate;
forming a charge storage electrode on the charge storage structure;
forming a tunnel diode dielectric layer on the substrate; and
forming a tunnel diode electrode on the tunnel diode dielectric layer,
wherein one of the charge storage electrode or the tunnel diode electrode laterally surrounds a periphery of the other of the charge storage electrode or the tunnel diode electrode.

14. The method of claim 13 wherein the forming the charge storage structure includes:
forming a first oxide layer on the substrate;
forming a nitride layer on the first oxide layer; and
forming a second oxide layer on the nitride layer.

15. The method of claim 13 wherein the forming the charge storage electrode includes forming a plurality of charge storage electrodes spaced apart from one another and laterally surrounding a periphery of the tunnel diode electrode.

16. The method of claim 13 wherein the forming the tunnel diode electrode includes forming a plurality of tunnel diode electrodes spaced apart from one another and laterally surrounding a periphery of the charge storage electrode.

17. A device, comprising:
a substrate having a doped region; and
a memory cell on the substrate, the memory cell including:
a charge storage device on the substrate, the charge storage device including a charge storage structure on the substrate, and a charge storage electrode on the charge storage structure;
a tunnel diode on the substrate adjacent to the charge storage device, the tunnel diode including a tunnel diode dielectric layer on the substrate, and a tunnel diode electrode on the tunnel diode dielectric layer,
wherein one of the charge storage electrode or the tunnel diode electrode laterally surrounds a periphery of the other of the charge storage electrode or the tunnel diode electrode.

18. The device of claim 17, further comprising:
a word line;
a write bit line;
a read bit line;
a first access transistor having a first conduction terminal electrically coupled to the write bit line, a second conduction terminal electrically coupled to the charge storage electrode, and a control terminal electrically coupled to the word line; and
a second access transistor having a first conduction terminal electrically coupled to the read bit line, a second conduction terminal electrically coupled to the tunnel diode electrode, and a control terminal electrically coupled to the word line.

19. The device of claim 18, wherein the first access transistor is configured to write data from the write bit line to the charge storage device in response to a first voltage applied to the control terminal of the first access transistor.

20. The device of claim 19, wherein the second access transistor is configured to apply a read voltage from the read bit line to the tunnel diode in response to a second voltage applied to the control terminal of the second access transistor.

* * * * *